(12) United States Patent
Kurosawa et al.

(10) Patent No.: US 7,454,831 B2
(45) Date of Patent: Nov. 25, 2008

(54) METHOD FOR MOUNTING AN ELECTRONIC ELEMENT ON A WIRING BOARD

(75) Inventors: Hirofumi Kurosawa, Tatsuno (JP); Yoshinori Hagio, Chino (JP)

(73) Assignee: Seiko Epson Corporation (JP)

( * ) Notice: Subject to any disclaimer, the term of this patent is extended or adjusted under 35 U.S.C. 154(b) by 274 days.

(21) Appl. No.: 11/269,183

(22) Filed: Nov. 8, 2005

(65) Prior Publication Data

US 2006/0103788 A1 May 18, 2006

(30) Foreign Application Priority Data

Nov. 16, 2004 (JP) .............................. 2004-331965

(51) Int. Cl.
*H05K 3/30* (2006.01)
(52) U.S. Cl. .............................. 29/832; 29/841; 29/846; 257/773; 427/466
(58) Field of Classification Search ........... 29/830–832, 29/834, 846, 851; 257/724, 759, 773, 777, 257/781, E23.06, E21.575; 361/779; 427/256, 427/261, 466; 438/107, 122, 622
See application file for complete search history.

(56) References Cited

U.S. PATENT DOCUMENTS

| | | | | |
|---|---|---|---|---|
| 3,903,590 A | * | 9/1975 | Yokogawa | ................. 438/107 |
| 4,600,907 A | * | 7/1986 | Grellman et al. | .............. 29/839 |
| 4,992,847 A | * | 2/1991 | Tuckerman | .................. 257/623 |
| 6,211,572 B1 | * | 4/2001 | Fjelstad et al. | .............. 257/781 |
| 6,501,663 B1 | * | 12/2002 | Pan | ............................. 361/779 |
| 6,599,582 B2 | * | 7/2003 | Kiguchi et al. | .............. 427/466 |
| 6,861,377 B1 | | 3/2005 | Hirai et al. | |
| 2003/0030689 A1 | | 2/2003 | Hashimoto et al. | |
| 2004/0155322 A1 | | 8/2004 | Cho et al. | |

FOREIGN PATENT DOCUMENTS

| | | |
|---|---|---|
| CN | 1459824 | 12/2003 |
| JP | 2000-216330 | 8/2000 |

* cited by examiner

*Primary Examiner*—Donghai D. Nguyen
(74) *Attorney, Agent, or Firm*—Harness, Dickey & Pierce, P.L.C.

(57) ABSTRACT

An electronic element (a semiconductor chip) is joining on a wiring board with the active surface thereof facing up (die-bonding step). A slope linked from the surface of the wiring board to the active surface of the electronic element is formed at the periphery of the electronic element (slope forming step). Metallic wiring for connecting electrode terminals on the active surface to wiring patterns on the wiring board is formed on the surface of the slope by a droplet ejection method (metallic wiring forming step). In the invention, prior to forming the metallic wiring, an organic insulating membrane formed of epoxy resin or urethane resin is formed on the active surface of the electronic element, on which the corresponding metallic wiring is formed (insulative ink processing step), thereby improving adhesivity.

8 Claims, 18 Drawing Sheets

METHOD FOR MOUNTING AN ELECTRONIC ELEMENT ON A WIRING BOARD

BACKGROUND OF THE INVENTION

1. Field of the Invention

The present invention relates to a preferable mounting method for face-up mounting of an electronic element such as a semiconductor chip on a wiring board and a preferable mounting structure therefor.

Priority is claimed on Japanese Patent Application No. 2004-331965 filed on Nov. 16, 2004, the content of which is incorporated herein by reference.

2. Description of Related Art

In recent years, in electronic instruments having portability and/or mobility such as, mainly, mobile telephones, notebook type personal computers, PDAs (personal data assistants), etc., downsizing of various types of electronic components (electronic elements) such as internally incorporated semiconductor chips has been attempted in order to miniaturize and lower the weight of the device.

Therefore, for example, in a semiconductor chip, packaging methods have been devised, and at present, ultra-small packaging or so-called CSPs (chip scale packages) have been provided.

In semiconductor chips produced using CSP technology, it is sufficient that the mounting area be equivalent to the area of the semiconductor chip, wherein high-density mounting has been achieved (for example, refer to Japanese Published Unexamined Patent Application, First Publication No. 2000-216330).

Such a semiconductor chip is mounted on a board (wiring board) having a wiring pattern for relocation formed thereon, and is incorporated in an electronic device. As a method for mounting a semiconductor chip, a face-down mounting has been known, in which the active surface of a semiconductor chip is mounted so as to be turned to the substrate side. However, in face-down mounting, it is necessary to prepare an exclusive substrate for an electrode structure of the semiconductor chip, resulting in an increase in cost. In addition, unnecessary processing such as formation of a bump electrode for connection is required. On the other hand, in face-up mounting in which a semiconductor chip is mounted with the active surface thereof facing upward, it is necessary to connect electrode terminals of the semiconductor chip with a wiring pattern of the wiring board one by one by wire bonding, wherein when the number of terminals is increased, it becomes difficult to cope therewith. Further, since there is a limit in the length of wiring in the case of wire bonding, a universal substrate cannot be used. Still further, there may be a case where a defect is caused due to mechanical stress when carrying out wire bonding.

SUMMARY OF THE INVENTION

The present invention was developed in view of such situations, and it is therefore an object of the invention to provide a method for mounting an electronic element, which is able to lower mechanical stress when the electronic element is mounted on a wiring board and achieve a mounting structure having high connection reliability at low cost.

In order to solve the above-described problems, a method for mounting an electronic element on a wiring board according to the invention is a method for mounting an electronic element on a wiring board, includes: disposing the electronic element on the wiring board; forming an organic insulating membrane on an active surface of the electronic element; forming an inclined surface connected from the surface of the wiring board to the active surface of the electronic element at the peripheries of the electronic element; and forming connection wiring for connecting electrode terminals secured on the electronic element to a wiring pattern secured on the wiring board on the inclined surface and the surface of the organic insulating membrane by means of a droplet ejection method.

In the present method, a face-up mounting method is employed as the method for mounting an electronic element, and a method of using connection wiring formed by a droplet ejection method instead of conventional wire bonding is employed as the method for securing continuance with a wiring board. For this reason, in comparison with the method for carrying out conventional wire bonding, stress applied to electronic elements can be relieved. Also, since the wires can optionally be re-routed (relocated) by connection wiring, it is possible to employ a universal substrate which is inexpensive.

In such a mounting structure, it is necessary to carry out plotting wiring directly on the active surface of an electronic element by the droplet ejection method. In this case, it has been made clear through studies made by the present inventor, that if plotting wiring is carried out without any preprocessing, wiring having sufficient reliability can not be formed. That is, usually, an inorganic insulating membrane such as $SiO_2$, SiN, etc., is formed on the active surface of a semiconductor chip, etc., being an electronic element as a passivation membrane. If plotting wiring is carried out on the surface of such an insulating membrane by the droplet ejection method, adhesion between the wiring and the backing insulating membrane is worse, wherein the reliability of the wiring is inferior. In the worst case, the wiring is caused to peel off from the backing insulating membrane, is disconnected and does not function as wiring. Also, if wiring is formed by the droplet ejection method, it is necessary to make the surface condition of the insulating membrane, on which wiring is formed, uniform in a proper state. If not, dropped droplets do not uniformly make the surface of the insulating membrane wet and do not uniformly spread thereon, wherein disconnection by which the wires are not linked with each other (insufficient spread) and short-circuiting with adjacent wiring (excessive spread) are brought about, and adequate wiring is not formed. Further, the surface of an actual semiconductor chip is not flat, wherein there are receded and projecting parts such as wiring and electrode terminals.

In addition, some of the examination electrodes (electrode pads in the scribe TEG) necessary in a production process of a semiconductor chip remain at the end portion of the surface of the semiconductor chip. If plotting wiring is carried out without processing such receded and projecting parts, dropped droplets spread along the receded and projecting patterns and a desired wiring pattern is not formed. Further, if wiring is formed on the electrode pads in the scribe TEG, a short-circuit or the like may occur in relation to an integrated circuit board, and the IC not normally operate. Where a mounting structure according to the invention is employed, it is necessary to solve such problems.

In order to solve such problems, in the invention, an organic insulating membrane is formed on necessary parts of the active surface of the electronic element in advance prior to plotting wiring. The organic insulating membrane has good affinity with an organic solvent used as a dispersion medium of droplets. Therefore, where plotting wiring is carried out on the organic insulating membrane, a sufficient adhesion force is obtainable between formed wiring and the backing organic insulating membrane. Thus, according to the mounting method of the invention, it is possible to relieve stress applied to electronic elements when mounting the same, by forming connection wiring by means of the droplet ejection method. Further, by providing an organic insulating membrane as the backing when forming connection wiring, the connection wiring can be prevented from peeling off, and the reliability thereof can be achieved.

In the method for mounting electronic elements according to the invention, it is preferable that the organic insulating membrane be made of an epoxy resin or a urethane resin.

By using such a material, the adhesion property can be further improved. For example, although the adhesion force is 1000 g/mm$^2$ where metallic wiring is formed with $SiO_2$ or SiN used as backing, the adhesion force is 5000 g/mm$^2$ where metallic wiring is formed with an epoxy resin or a urethane resin used as the backing. Also, in a tape peeling test, the metallic wiring is completely peeled off in the former case. However, in the latter case, the metallic wiring remains without being peeled off.

In the method for mounting electronic elements according to the invention, the organic insulating membrane can be formed by means of the droplet ejection method.

According to the method, it is possible to selectively form an organic insulating membrane only at necessary parts.

In the method for mounting electronic elements according to the invention, a projecting portion is formed on the active surface, and the forming a organic insulating membrane may include forming a first organic insulating membranes forward and backward of the projecting portion by the droplet ejection method, and forming, by the droplet ejection method, a second organic insulating membrane extended over the first organic insulating membrane forward and backward of the projecting portion.

As described above, the surface of an actual electronic element is not flat, but various types of uneven parts are formed therein. If such unevenness exists, when droplets spread along the projecting surfaces, there may be cases where wires adjacent to each other are short-circuited. In the method according to the invention, in order to prevent droplets from spreading on such projecting surfaces, plotting of organic insulating membranes is carried out two times. That is, in this method, the first time, droplets are ejected avoiding the projecting portions, and are dried up, thereby forming the first organic insulating membranes forward and backward of the projecting portions, and the second time, droplets are ejected to overlap the first organic insulating membranes forward and backward of the projecting portions, extended over the projecting portion so as form into a line the first organic insulating membranes. Where plotting is carried out with droplets overlapped on droplets, since the upper-layered droplets are easily fixed to the landing positions, droplets of the second time are made into a state where both sides thereof are fixed, wherein there are no cases where the droplets greatly spread along the projecting surfaces. Therefore, predetermined patterns can be formed without being influenced by the projecting portions.

The method for mounting electronic elements according to the invention may include making the active surfaces liquid affinity before forming the organic insulating membrane. It is preferable that the contact angle of droplets be 90° or less, further preferably 20° or less in order to form an organic insulating membrane. In a case where the active surface is made liquid affinity, it is preferable that the contact angle be in this range. Also, the method for mounting electronic elements according to the invention may include making the surface of the organic insulating membrane liquid affinity before forming the connection wiring. It is preferable that the contact angle of droplets be 90° or less, further preferably 60° to 30° in order to form a connection wiring. In a case where the surface of the organic insulating membrane is made liquid affinity, it is preferable that the contact angle be in this range.

According to these methods, fixation of droplets can be made satisfactory when forming organic insulating membranes and connection wiring.

A method for producing an electronic device according to the invention is a method for producing an electronic device in which electronic elements are mounted on a wiring board, wherein mounting the electronic elements is carried out by the above-described method for mounting electronic elements according to the invention.

According to this method, it is possible to provide an electronic device having high connection reliability at low cost.

A circuit board according to the invention is provided with an electronic device produced by the above-described method for producing an electronic device according to the invention. Also, an electronic instrument according to the invention is provided with an electronic device produced by the above-described method for producing an electronic device according to the invention or the circuit board according to the invention.

With such a construction, it is possible to provide a circuit board and an electronic device, which have high connection reliability, at low cost.

DETAILED DESCRIPTION OF THE INVENTION

Embodiment 1

Hereinafter, a description is given of embodiments of the invention with reference to the accompanying drawings. In all the following drawings, membrane thickness and ratios of respective components are adequately made different in order to make the drawings easy to understand.

Liquid Crystal Display Apparatus

Figure 1:
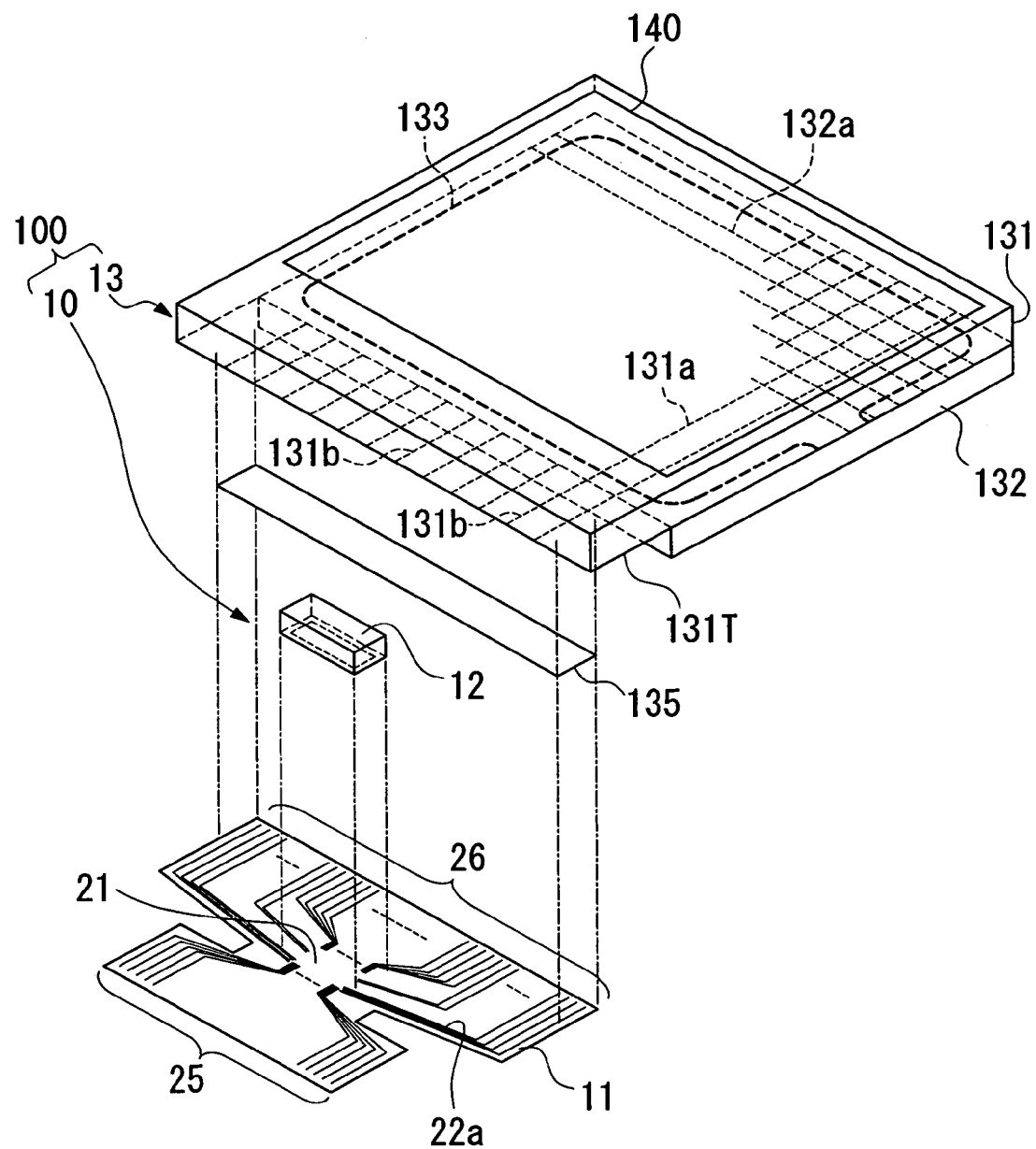
FIG. 1 is a disassembled perspective view of a liquid crystal display apparatus according to Embodiment 1.

FIG. 1 is a disassembled perspective view depicting a liquid crystal display apparatus being one example of an electronic instrument according to the invention. A liquid crystal display apparatus 100 in FIG. 1 includes a liquid crystal panel 13 and a circuit board 10 for driving it. Also, as necessary, an illumination unit such as a backlight device, and other incidental structures may be attached to the liquid crystal panel 13. The liquid crystal panel 13 includes a pair of substrates 131 and 132 whose peripheries are adhered to each other by a sealing material 133. Liquid crystal of, for example, the STN type (Super Twisted Nematic) is sealed in a clearance formed between the substrates 131 and 132, as so-called a cell gap. The substrates 131 and 132 are composed of a transparent material such as, for example, glass and synthetic resin, etc. A polarizing plate 140 is adhered to the outsides of the substrates 131 and 132, and a phase differential plate (not illustrated) is inserted between at least one of the substrates 131 and 132 and the polarizing plate 140. A display electrode 131a is formed on the inner surface of one substrate 131, and a display electrode 132a is formed on the inner surface of the other substrate 132. These display electrodes 131a and 132a are formed to be stripe-shaped, or in another appropriate pattern such that of as a character, a numeral, etc. In addition, the display electrodes 131a and 132 are formed of a transparent conductive material such as, for example, ITO (Indium Tin Oxide), etc.

The liquid crystal panel 13 includes an extended portion 131T in which one substrate 131 extends from the other substrate 132, and a plurality of connection terminals 131b are formed at the extended portion 131T. These connection terminals 131b are formed simultaneously with the display electrodes 131a when forming the display electrodes 131a on the substrate 131, and are composed of, for example, ITO. Some of these connection terminals 131b are connected to the display electrode 131a and others are connected to the display electrodes 132a. As for the display electrodes 132a, wiring from the connection terminals 131b is connected to the display electrode 132a on the other substrate 132 via a conductive member included in the sealing material 133. Further, in practice, a number of the display electrodes 131a and 132a and connection terminals 131b are formed on the substrate 131 and the substrate 132 at remarkably narrow intervals. In FIG. 1, in order to clearly show the structure thereof, the thereof are enlarged and schematically depicted. In addition, only several lines thereof are illustrated with the other lines omitted. Also, a connection state between the connection terminals 131b and the display electrode 131a and a connection state between the connection terminals 131b and the display electrode 132a are omitted in FIG. 1.

The circuit board 10 is provided with a film substrate 11 being a matrix, a wiring pattern 22a formed on the film substrate 11, an input terminal portion 25, an output terminal portion 26, a mounted area of semiconductor IC (element mounting area) 21, and a liquid crystal drive IC (semiconductor device) 12. The film substrate 11 is formed of a polyimide resin whose thickness is low, for example, less than 55 µm, in particular, less than 25 µm, and has flexibility by which bending is enabled at any part, and which has an insulating property. That is, the circuit board 10 is a flexible substrate of a COF type (chip on film type) in which the liquid crystal drive IC 12 is mounted on the semiconductor IC mount area 21 of the film substrate 11. Also, the film substrate 11 is not necessarily a polyimide resin, but may be a resin material or an organic material which can be bent at any part. For example, polyethylene terephthalate, polyester, and a liquid crystal polymer may be used.

The circuit board 10 is connected to the extended portion 131T of the substrate 131 of the liquid crystal panel 13 by means of an anisotropic conductive film (ACF) 135. The anisotropic conductive film 135 is formed of adhesive resin and conductive particles mixed therein. By pressure-fitting via the adhesive resin, the circuit board 10 and the substrate 131 are fixed, and respective terminals of the output terminal portion 26 at the circuit board 10 side are conductively connected to the connection terminals 131b of the liquid crystal panel 13 via conductive particles. Control signals, picture signals and power source potential, etc., are supplied from outside into the liquid crystal drive IC via the input wiring patterns 22a. Liquid crystal drive signals (output signals) are generated in the liquid crystal drive IC 12, and are supplied to the liquid crystal panel 13. Since the circuit board 10 according to the present embodiment is formed by using a film substrate 11 having sufficient flexibility, it is possible to bend the circuit board 10 at any part other than the semiconductor IC mount area 21. Further, since all the wiring patterns 22a are formed on the film substrate 11, it is possible to prevent the strength of the wiring pattern 22a from becoming short-lived and to prevent the wiring patterns 22a from being short-circuited. Accordingly, the above-described circuit board 10 has high reliability.

-Method for Producing Electronic Devices-

Next, a description is given of a liquid crystal drive IC 12 (hereinafter called an "IC") which is one example of an electronic device according to the invention. In the present embodiment, the IC 12 is such that a semiconductor chip (Bare Chip) being an electronic element is mounted on a wiring board composed of a glass epoxy 2-layered substrate and the same semiconductor chip is packaged with BGA disposed on the rear side thereof.

Hereinafter, a description is given of the method for producing the liquid crystal drive IC 12.

Figure 2:
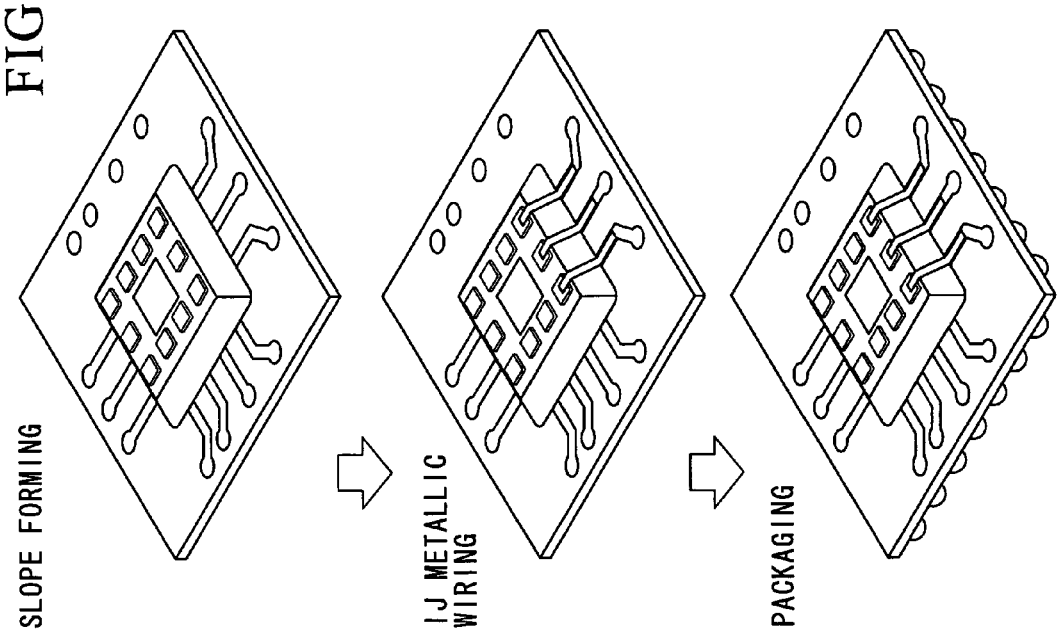
FIG. 2 is a flowchart showing a production process of a semiconductor IC.
Figure 2:
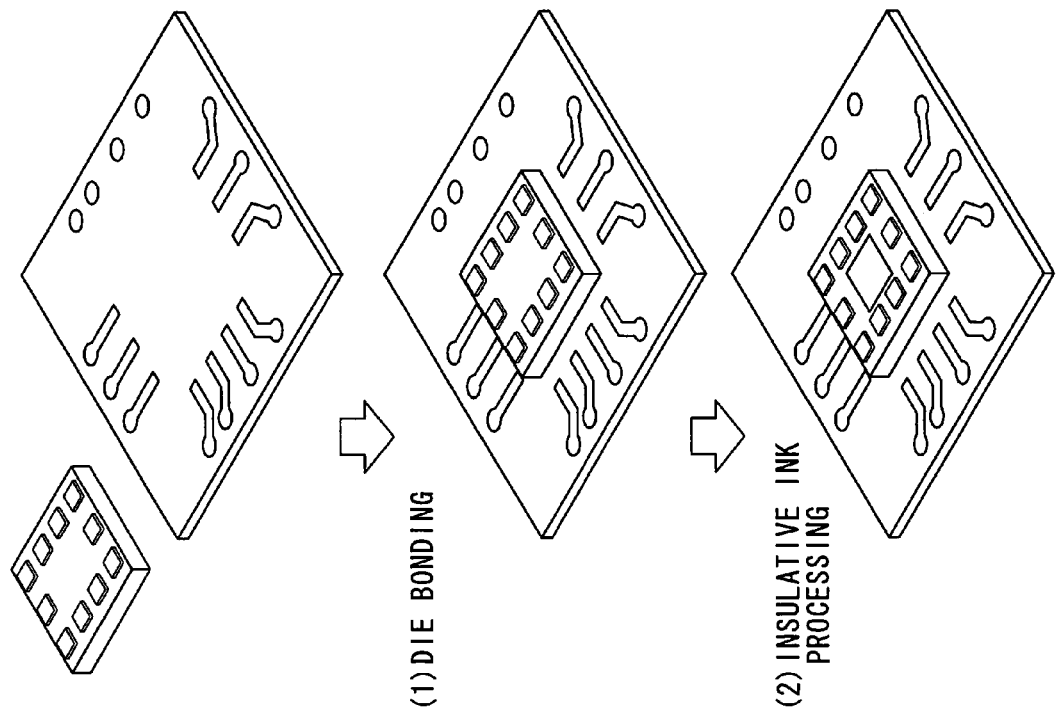

FIG. 2 briefly depicts a production step of the IC 12. In regard to the method for producing the IC 12 according to the present invention, a face-up mounting method is employed as a method for mounting a semiconductor chip on a wiring board, and, as the method for wiring connection, a connecting method using metallic wires (connection wiring) formed by a droplet ejection method is employed instead of conventional wire bonding. The method for producing the IC 12 according to the invention is provided in five steps that are, (1) a die bonding step, (2) an insulative ink processing step, (3) a slope forming step, (4) a metallic wiring forming step, and (5) a packaging step. In addition, the producing method is not limited to the above-described steps, and as necessary, the other steps may be omitted or other steps may be added.

(1) Die-Bonding Step

Figure 3A:
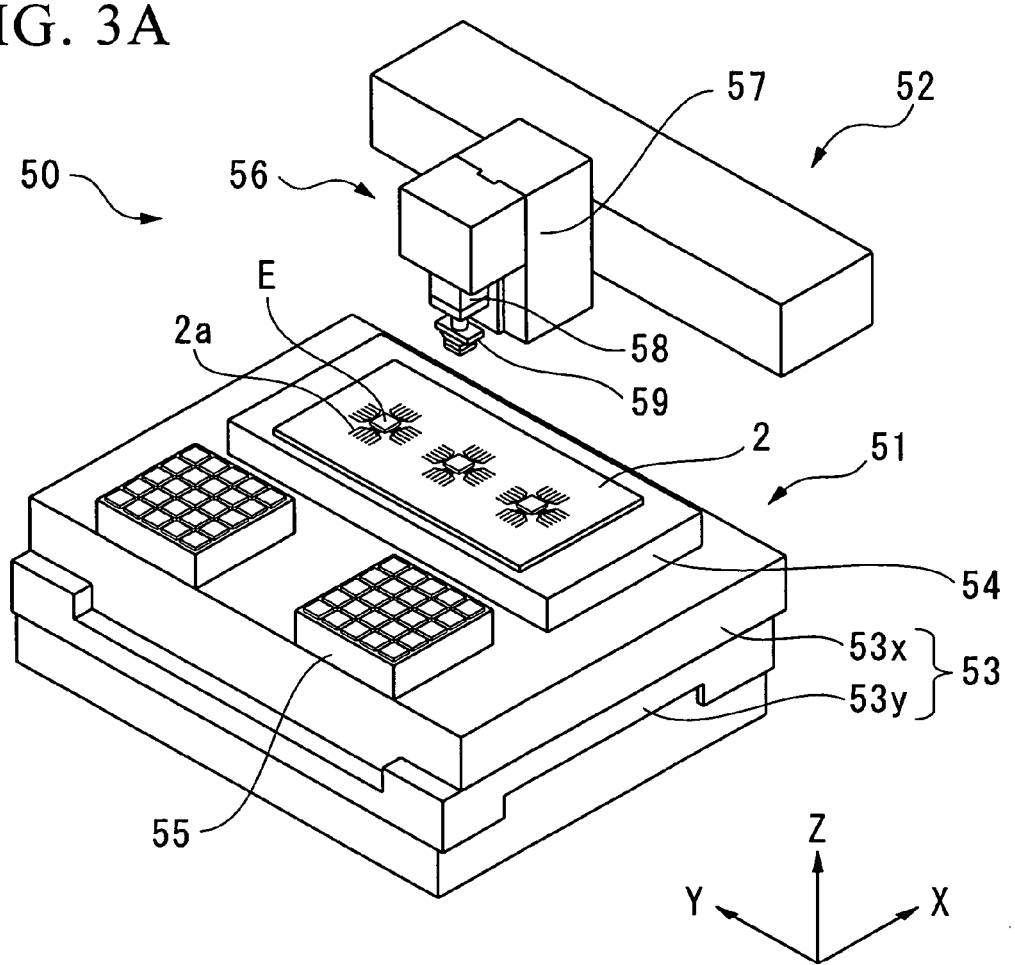
FIG. 3A is a perspective view showing a configuration of a die-bonding apparatus.
Figure 3B:
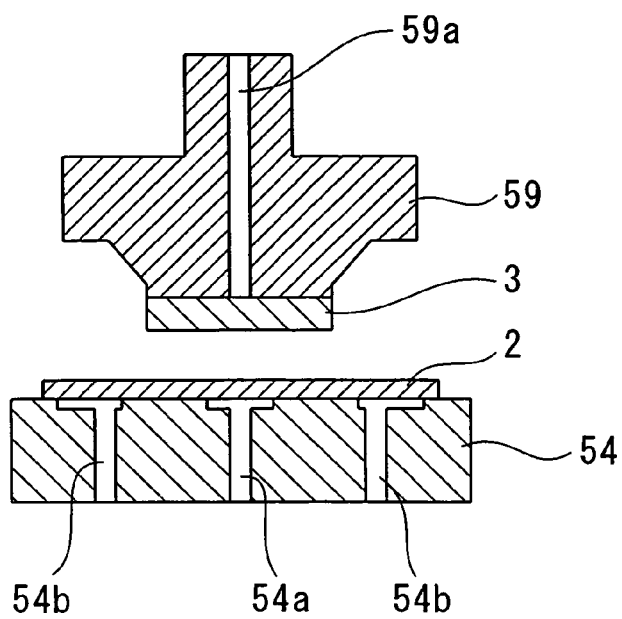
FIG. 3B is a side sectional view showing the major parts of the apparatus.

First, a semiconductor chip (bare chip) is joined to a wiring board using an exclusive fixture. FIG. 3A is a perspective view showing a configuration of a die-bonding apparatus, and FIG. 3B is a side sectional view showing the major parts of the die-bonding apparatus.

As depicted in FIG. 3A, the die-bonding apparatus 50 is basically composed of a table portion 51 and a connection head portion 52. The table portion 51 is composed of a movement table portion 53, a substrate holder (substrate placing base) 54, and a semiconductor element mounting portion 55. The connection head portion 52 is composed of a head supporting portion 56, a vertical movement mechanism 57, a tool turning mechanism 58, and a heating/pressing tool (heating/pressing means) 59. Further, the movement table portion 53 is composed of an X stage 53x and a Y stage 53y.

Herein, a description is given of respective components.

The table portion 51 is provided downward of the die-bonding apparatus 50 body. Since the movement table portion 53 is provided with the X stage 53x and Y stage 53y, the substrate holder 54 is freely movable in the XY plane, and can be fixed at any position. Further, the table portion 51 is provided with the semiconductor element mounting portion 55. A plurality of unmountede semiconductor chips 3 are incorporated in the semiconductor element mounting portion 55. The wiring board 2 is placed on the substrate holder 54. For example, a glass epoxy two-layered substrate is employed as the wiring board 2. A rectangular mounting area E for mounting the semiconductor chips 3 is configured in the wiring board 2. A number of wiring patterns 2a are formed in the periphery of the mounting area E, which are connected to the electrode terminals of the semiconductor chips 3. Electronic circuits (integrated circuits) are formed on the active surface sides in the semiconductor chips 3. Electrode terminals that become the peripheral electrodes of the electronic circuits are formed on the active surface on which the electronic circuits are formed. In the present embodiment, the semiconductor chips 3 are mounted with the active surface located upside.

The connection head portion 52 is provided on the upper part of the die-bonding apparatus 50. The turning around the Z axis of the semiconductor chips 3 is determined by the tool turning mechanism 58 secured in the head supporting portion 56. The semiconductor chips 3 retained by the heating/pressing tool 59 are heated and pushed onto the wiring board 2. The semiconductor chips 3 are connected at predetermined positions on the wiring board 2 by the vertical movement mechanism 57.

In detail, the vertical movement mechanism 57 is moved in the Z-axis direction in the drawing by driving means such as an air cylinder, motor, etc. By elongation action of the vertical movement mechanism 57, the semiconductor chips 3 retained by the heating/pressing tool 59 are moved in the perpendicular direction. The semiconductor chips 3 are pressurized, via the adhesive agent 4, onto the wiring board 2 placed on the upper surface of the substrate holder 54 via the vertical movement mechanism 57. The pressure may be 1 through 3.5 MPa or so. Further, in line with the press, the semiconductor chips 3 and adhesive agent 4 are heated by the heating/pressing tool 59.

The heating/pressing tool 59 is internally provided with a heating mechanism such as a heater, etc. In regard to the heating mechanism, a constant heat system is employed, wherein the heating/pressing tool 59 is set to a predetermined temperature in a temperature range of 200 to 450° C. The bottom surface (the surface brought into contact with the semiconductor chips 3) of the heating/pressing tool 59 is formed flat. It is preferable that a fixture for regulating the shape of the surface brought into contact with the semiconductor chips 3 be attachable to the bottom surface of the heating/pressing tool 59. The fixture can be selected for use from a plurality of fixtures in compliance with the plane shape of the semiconductor chips 3 responsive to the IC 12 to be produced. With use of the above-described fixture, the surface of the heating/pressing tool, which is brought into contact with the semiconductor chips 3, may be set to an optional shape such as a square shape, a slender rectangular shape, or other shapes.

As depicted in FIG. 3B, the heating/pressing tool 59 and the substrate holder 54 are provided with a mechanism for retaining the semiconductor chips 3. In detail, the heating/pressing tool 59 is provided with a suction opening 59a for suctioning and retaining the semiconductor chips 3, and the substrate holder 54 is provided with suction openings 54a and 54b. The suction openings 59a, 54a and 54b are connected to a pressure-reducing pump (not illustrated). By driving and controlling the above-described pressure-reducing pump, the semiconductor chips 3 and wiring substrate 2 can be attached to and detached from the heating/pressing tool 59 or the substrate holder 54.

In addition, in the present embodiment, although such a construction is employed, in which the wiring substrate 2 is fixed by utilization of an suction force by driving the pressure-reducing pump, the present invention is not limited thereto. For example, means for fixing the wiring substrate 2 onto the substrate holder 54 may be constructed so that a ferromagnetic substance is disposed at a part of the substrate holder 54 and a magnetic force operating between the ferromagnetic substance and a magnet is utilized. Furthermore, the fixing means may be constructed so that it includes a recess portion formed on the substrate holder 54 and communicating with the second suction hole 54 in addition to the second suction hole 54b.

Figure 4A:
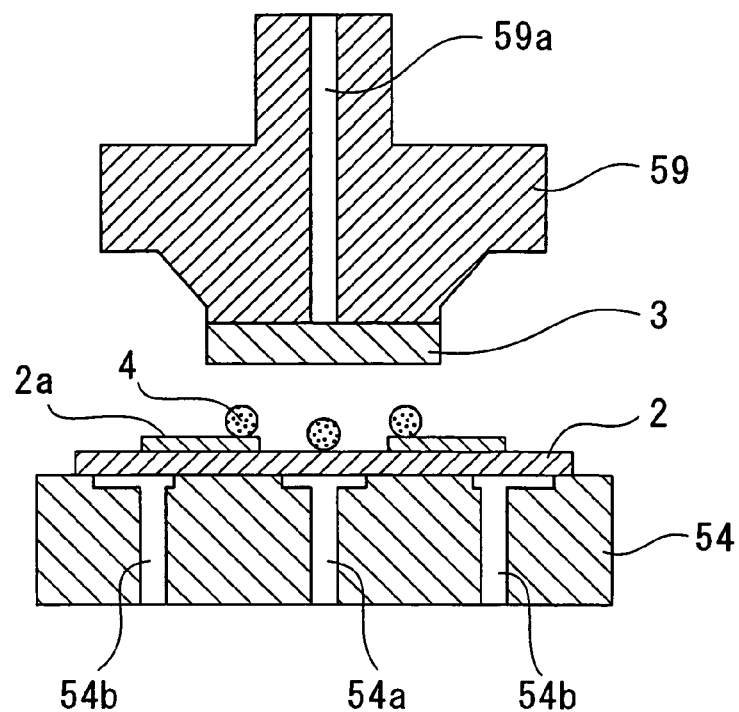
FIG. 4A and FIG. 4B are schematic sectional views showing a die-bonding process.
Figure 4B:
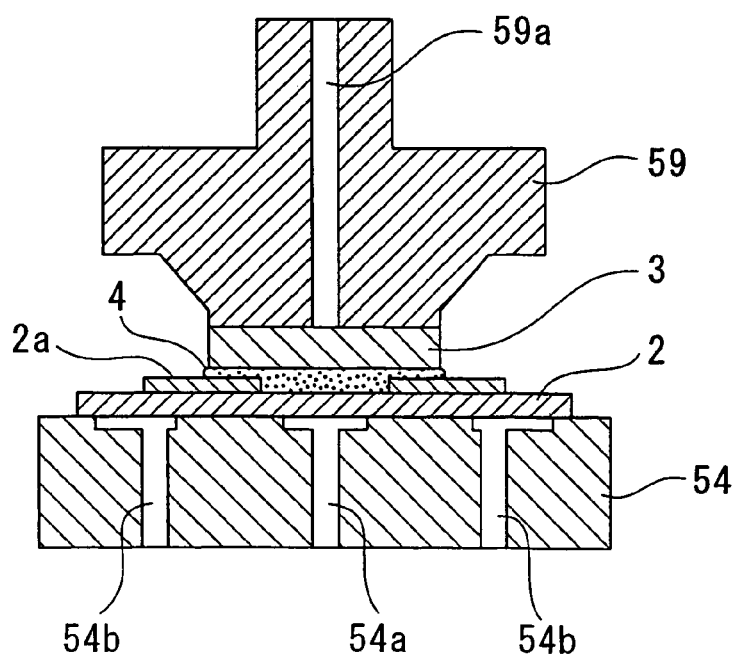

Next, referring to FIG. 4A and FIG. 4B, a description is given of a joining process of semiconductor chips utilizing the above-described die-bonding apparatus.

FIG. 4A and FIG. 4B are sectional views showing the joining process.

First, as depicted in FIG. 4A, the heating/pressing tool 59 suctions and retains the semiconductor chips 3, and the substrate holder 54 suctions and fixes the wiring substrate 2. In detail, the vertical movement mechanism 57 and the movement table portion 53 (refer to FIG. 3) are driven, and the heating/pressing tool 59 suctions and retains the semiconductor chips 3 mounted on the semiconductor element mounting portion 55 (refer to FIG. 3). After that, the semiconductor chips 3 are disposed opposite the wiring substrate 2. The wiring substrate 2 is suctioned to the substrate holder 54 via the suction openings 54a and 54b.

An adhesive agent 4 is adhered, in advance, to the wiring pattern 2a which is a connection area of the wiring substrate 2. The adhesive agent 4 is like a plurality of dots whose diameter is made small, and is dispersed and disposed in the joining area. As described later, a slope 6A is formed at the sides of a joined semiconductor chip in the IC 12 according to the present embodiment, and metallic wiring for connection is formed on the slope 6A (refer to FIG. 12B). At this time, if the slope is steep, the metallic wiring is peeled off, and disconnection of the wiring may easily occur. Therefore, it is necessary to make the thickness of the semiconductor chip including the adhering layer as thin as possible. As usual, if an adhesive agent is disposed on the entirety of the joining portion in the state of a lump, it becomes difficult to form a gradual slope because the adhesive layer is made too thick. For example, where a DAF film for normal die bonding is used, the thickness of the adhesive layer is greater than that of the semiconductor chip. Accordingly, in the present embodiment, in order to make the thickness of the adhesive agent low, the adhesive agent 4 is made into spheres with small diameters and a plurality of adhesive agent spheres are disposed on the joining portion.

Next, as depicted in FIG. 4B, as the vertical movement mechanism 57 extends, the heating/pressing tool 59 descends, and the rear side of the semiconductor chip 3 is brought into contact with the adhesive agent 4. The adhesive agents 4 are spread by causing the heating/pressing tool 59 to further descend. The adhesive agent 4 is heated and cured in a pressurized state. Such heating and pressurizing are carried out in a state where the temperature of the heating/pressing tool 59 is adjusted to be in a range of 210 to 450° C. so that, for example, the temperature of the adhesive agent 4 becomes 150 to 230° C. Also, the cylinder is set so that the pressure applied by the heating/pressuring tool 59 onto the wiring board 2 becomes 1.3 through 3.5 MPa or so. In addition, the time during which the heating/pressing tool 59 heats and pressurizes the wiring board 2 is 3 through 15 seconds.

After the above processes are over, the heating and pressurization are stopped, and the vertical movement mechanism 57 is withdraw to contract, thereby spacing the heating/pressing tool 59 from the wiring substrate 2, whereby the semiconductor chip 3 is joined to the active surface of the mounting area of the wiring board 2.

Figure 5:
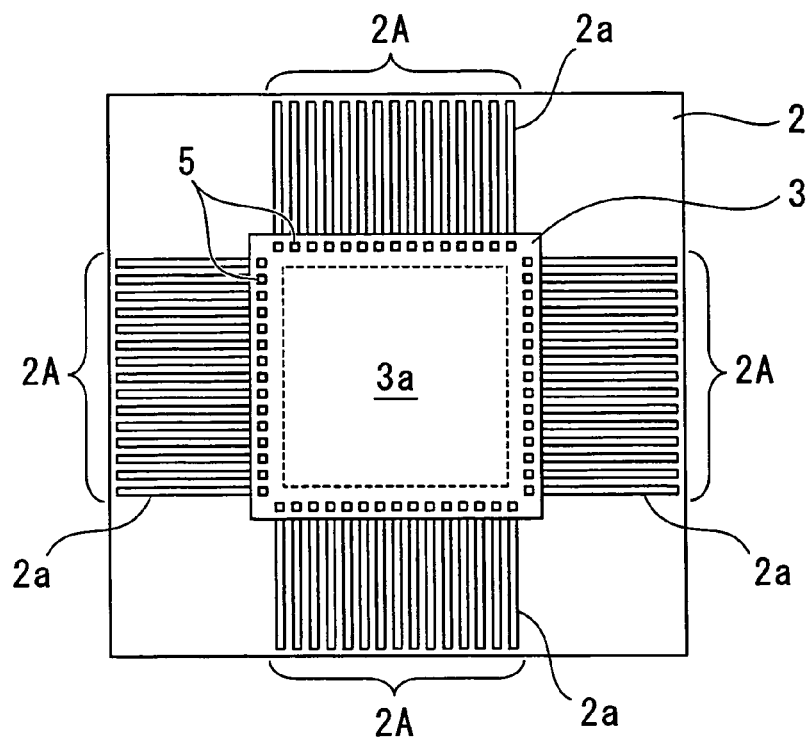
FIG. 5 is a schematic plan view depicting a state after die-bonding.

FIG. 5 is a plan view showing the state after joining. In FIG. 5, reference numeral 2a denotes a wiring pattern formed on the wiring board 2, and 3a denotes an active surface of the semiconductor chip 3. The wiring pattern 2a is provided so as to correspond to the electrode terminals 5 of the respective semiconductor chips 3. A number of wiring patterns 2a are arrayed along the edge sides of the semiconductor chip 3. A wiring group 2A is formed of these wiring patterns 2a. In the wiring board according to the present embodiment, such a wiring pattern 2a is provided at all four sides of the semiconductor chip 3. Therefore, the wiring group 2A is formed in regard to all four sides. The wiring pattern 2a of the respective wiring groups 2A is disposed perpendicularly to the corresponding side or disposed at an angle. Also, a portion encircled by a dotted line in FIG. 5 is an area in which a circuit portion (integrated circuits) is formed. The electrode terminals 5 function as peripheral electrodes of the circuit portion.

(2) Insulative Ink Processing Step

Figure 6:
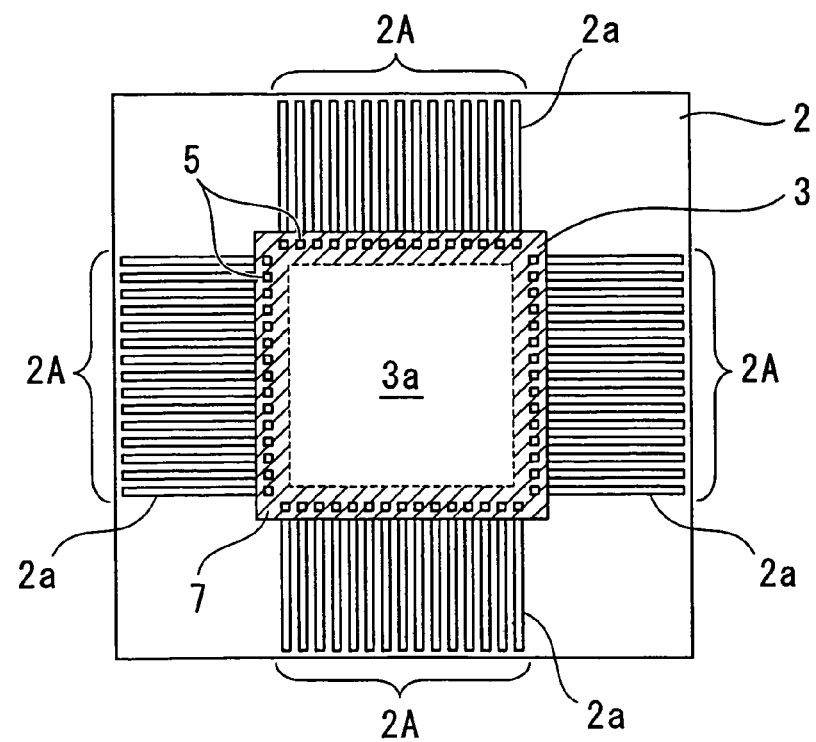
FIG. 6 is a schematic plan view depicting a state after insulative ink processing.

Next, as depicted in FIG. 6, an organic insulating membrane 7 is formed on the active surface 3a by ejecting an insulative ink (droplets including an insulative material) onto the corresponding active surface 3a of the semiconductor chip 3. The organic insulating membrane 7 is provided out for preparation to form metallic wiring 8 to be described later.

As described later, in the mounting method according to the present embodiment, plotting wiring is performed, by a direct droplet ejection method, on the active surface 3a of the semiconductor chip 3. In this case, it has been made clear by studies of the present inventor that, if plotting is carried out without any preprocess, metallic wiring 8 having sufficient reliability cannot be formed. That is, usually, an inorganic insulating membrane such as $SiO_2$ and SiN, etc., is formed on the active surface 3a of the semiconductor chip 3 as a passivation membrane. If plotting wiring is performed on the surface of such an insulating membrane by a droplet ejection method, the adhesion between the wiring 8 and the under-layered insulating membrane is worse, wherein the reliability of the wiring 8 is worsened. In the worst case, the wiring 8 is peeled off from the under-layered insulating membrane, is disconnected, and may not function as wiring. Also, when forming wiring by the droplet ejection method, it is necessary that the surface state of the insulating membrane having wiring formed thereon be made uniform in an adequate state. If not, dropped droplets do not uniformly spread on the insulating membrane, wherein disconnection occurs by which the wiring is not connected, and a short-circuit (excessive spread) with adjacent wiring occurs, and adequate wiring cannot be formed. Further, the surface of an actual semiconductor chip 3 is not even, but there are receded and projecting parts such as wiring and electrode terminals. In addition, some of electrodes (electrode pads in the scribe TEG) for inspection, which are necessary in the production process of the semiconductor chips 3 remain on the surface end portion of the semiconductor chips 3. If plotting wiring is performed without treating such receded and projecting parts, dropped droplets spread along the receded and projecting patterns, and a predetermined wiring pattern 8 is not formed. Further, if wiring is formed on the electrode pads for the scribe TEG, a short-circuit with the IC body occurs, and the IC does not operate normally.

In the invention, in order to solve the problems, an organic insulating membrane 7 is formed on necessary points (for example, an area from the vicinity of the electrode terminals 5 to the end portions of the active surface 3a) of the active surface 3a prior to plotting wiring. The organic insulating membrane 7 is compatible with an organic solvent used as a dispersion medium of droplets. Therefore, where plotting wiring is performed on the organic insulating membrane 7, a sufficient adhesive force can be obtained between the wiring 8 formed and the under-layered organic insulating membrane 7.

It is preferable that epoxy resin and urethane resin be used as the organic insulating membrane 7. In practice, metal wiring 8 having excellent adhesivity can be formed by using these materials.

For example, although the adhesion force was $1000 \text{ g/mm}^2$ in a case where the metallic wiring 8 was formed with $SiO_2$ or Sin used as the underlayer, the adhesion force was $5000$ $\text{g/mm}^2$ in a case where the metallic wiring 8 was formed with epoxy resin or urethane resin used as the underlayer. Also, in a tape peeling test, although the former was completely peeled off, the latter remained without being peeled off.

Herein, a description is given of a droplet ejection apparatus used for formation of the organic insulating membrane 7.

Figure 8:
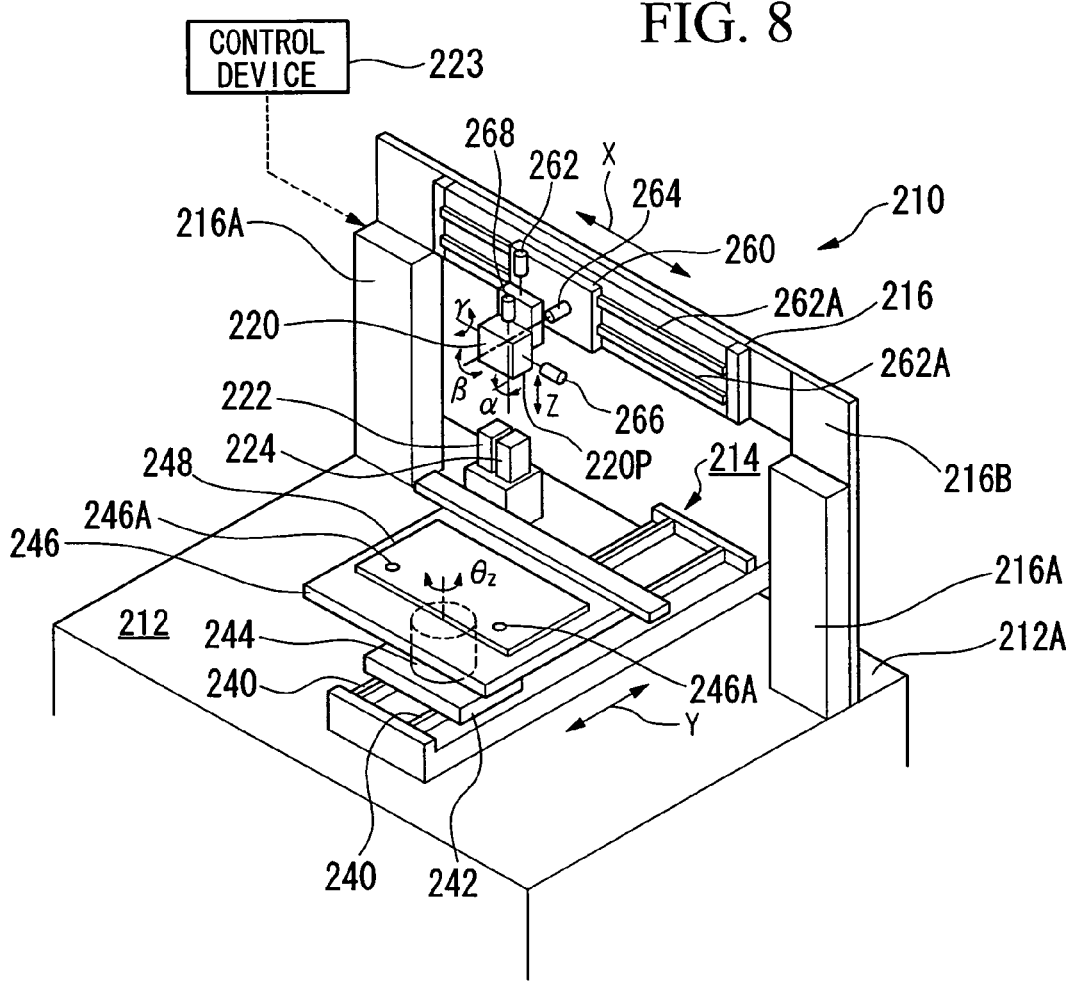
FIG. 8 is a perspective view depicting an ink jet apparatus which is one example of a droplet ejection apparatus.

FIG. 8 is a perspective view showing an ink jet apparatus which is one example of the droplet ejection apparatus.

In FIG. 8, the X direction is the direction of the base 212, the Y direction is the direction perpendicular thereto, and the Z direction is the vertical direction thereof. The droplet ejection apparatus 210 is mainly composed of a droplet ejection head (hereinafter called a "head") 220 and a table 246 on which the wiring board 2 is placed. Also, operations of the droplet ejection apparatus 210 are controlled by the control device 223.

The table 246 having the wiring board 2 placed thereon is moved and positioned in the Y direction by the first moving means 214, and is swung and positioned in the θz direction by a motor 244. On the other hand, the head 220 is moved and positioned in the X direction by the second moving means and is moved and positioned in the Z direction by a linear motor 262. Also, the head 220 is swung and positioned in the α,β, and γ directions by motors 264, 266 and 268, respectively, wherein the relative position and posture between the ink ejection surface 220P of the head 220 and the wiring board 2 on the table 246 are accurately controlled.

Figure 9:
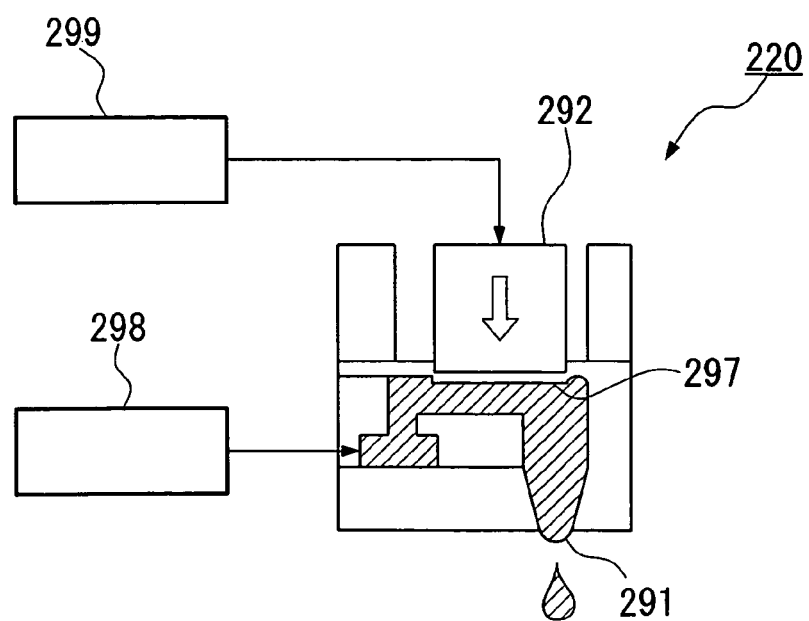
FIG. 9 is a schematic sectional view of a droplet ejection head.

Herein, a description is given of a structural example of the head 220 with reference to FIG. 9. FIG. 9 is a side sectional view showing the droplet ejection head. The head 220 ejects ink 221 through a nozzle 291 by a droplet ejection system. Various types of technologies that have been publicly known are applicable as the droplet ejection system, for example, a piezoelectric system for ejecting ink using piezoelectric elements as a piezoelectric material element, and a system for ejecting ink by means of bubbles generated by heating the ink.

FIG. 9 is a configurational view showing the droplet ejection head to explain the ejection principle of a liquid material by the piezoelectric system. In FIG. 9, a piezoelectric element 292 is installed adjacent to a liquid chamber 297 for accommodating a liquid material (ink: functional liquid). A liquid material is supplied into the liquid chamber 297 via a liquid material supply system 298 including a liquid tank for accommodating the liquid material. The piezoelectric element 292 is connected to a drive circuit 299. Voltage is applied to the piezoelectric element 292 via the drive circuit 299, and the piezoelectric element 292 is deformed to cause the liquid chamber 297 to be elastically deformed. The liquid material is ejected through the nozzle 291 on the basis of a change in the volume, which results from the elastically deformation. In this case, by varying the value of applied voltage, the distortion amount of the piezoelectric element 292 is controlled. Also, the distortion rate of the piezoelectric element 292 is controlled by varying the frequency of the applied voltage. In the liquid ejection based on the piezoelectric system, since no heat is applied to the material, there is an advantage in that the composition of the material is not substantially influenced.

Also, in order to prevent the ink ejection surface 220P in the head 220 from being dried, the capping unit 222 depicted in FIG. 8 caps the ink ejection surface 220P when the droplet ejection apparatus 210 stands by. A cleaning unit 224 suctions the interior of the nozzle in order to remove clogging of the nozzle in the head 220. Also, the cleaning unit 224 is capable of wiping the ink ejection surface 220P in order to remove stains of the ink ejection surface 220P in the head 220.

Next, a description is given of a process for forming an organic insulating member, using the above-described droplet ejection apparatus 210.

In the embodiment, a semiconductor chip 3 is treated, as a preprocess, by a UV treating apparatus (wavelength λ=254 nm) for ten minutes. By the treatment, the active surface 3a of the semiconductor chip 3 is made liquid affinity. As a process for making the active surface liquid affinity, dry or wet treatment other than the UV treatment may be carried out. In these processes, it is preferable that the contact angle of droplets on the active surface be 90° or less, or further preferably 20° or less. If the above-described contact angle is secured without any treatment for making liquid affinity, such a treatment is not required.

Next, droplets (insulative ink) including an insulative material such as epoxy resin, etc., are caused to fall on necessary points (areas on which metallic wiring 8 is formed) of the active surface 3a. An organic solvent such as γ buthyl lactone, etc., may be used as a solvent for droplets or a dispersion medium thereof.

Figure 7A:
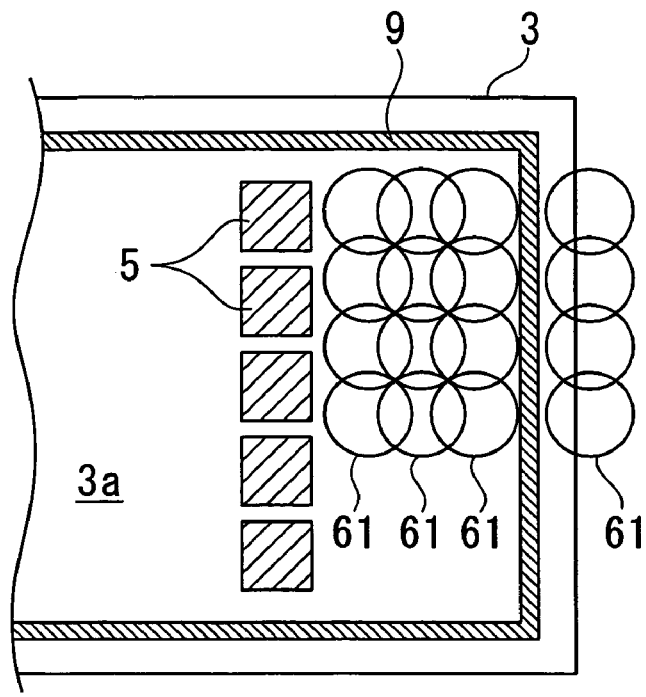
FIG. 7A and FIG. 7B are schematic plan views depicting an insulative ink processing step.
Figure 7B:
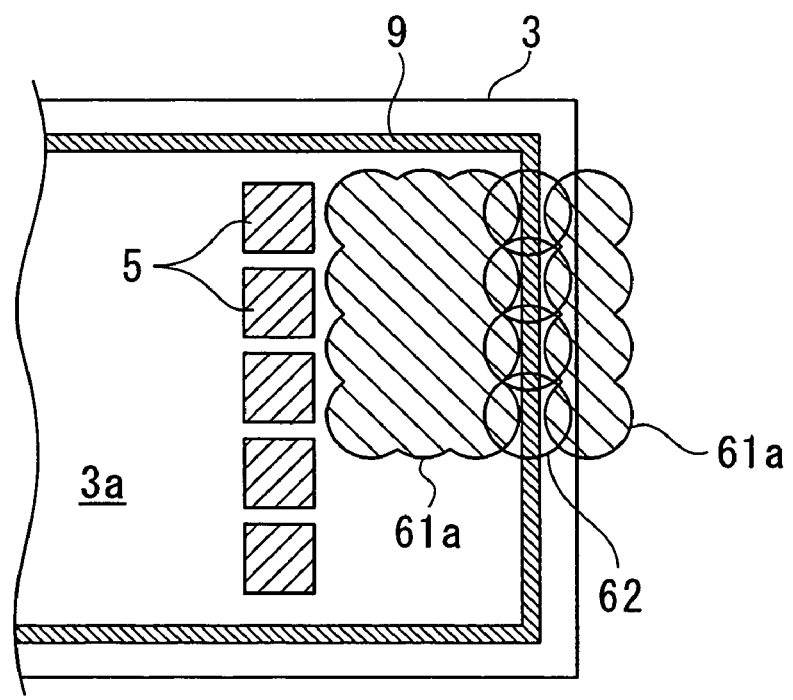

FIG. 7A and FIG. 7B are views showing a process for disposing droplets.

In the present embodiment, droplets are ejected with the in two processes. In the first process, as depicted in FIG. 7A, droplets 61 are dropped onto the active surface of the semiconductor chip 3 so that the dropped area is between the electrode terminals 5 and the edge of the active surface 3a, without any portion being left uncoated, avoiding the electrode terminals 5 and the guard ring 9 being the projected portions. It is preferable that the dropping pattern of the droplets 61 be made to have a pitch at which the droplets overlap adjacent coated droplets by one-third or so that no clearance is left over between the droplets. Positioning of the droplets is carried out, utilizing an alignment mark (not illustrated) on the active surface 3a. The alignment mark is located at a position where droplets are not disposed. After the first process is over, as depicted in FIG. 7B, the droplets 61 are dried, and the first dried membrane (the first organic insulating membrane) 61a is formed. Droplets 62 are dropped on the guard ring 9 being the projecting portion as the second process. Then, by drying the droplets 62, the second dried membrane (the second organic insulating membrane), which overlap the dried membranes 61a forward and backward of the guard ring 9, is formed. As described above, the surface of actual semiconductor chips 3 is not even, and various types of receded and projecting steps are formed. If such receded and projecting steps exist, droplets ejected onto a projecting portion are not fixed to the projecting portion but separate to both sides of the projecting portion or are disposed lopsidedly to either side of the projecting portion. In the present embodiment, in order to prevent such a situation, plotting of the organic insulating membrane 7 is carried out two times. In this method, droplets 61 are ejected, avoiding the projecting portion, in the first process, and the first dried membrane 61a is formed on either side of the projecting portion 9 by drying the same. Droplets 61 are ejected onto the projecting portion 9 extended over the dried membrane 61a in the second process. Where droplets overlap among the droplets for plotting, the upper-layered droplets are apt to be fixed to the landing positions of the droplets of the first process. The liquid membrane formed by the droplets of the first process assumes the role of a receiving plane with respect to the upper-layered droplets (quasi-receiving plane), and displays a satisfactory fixation property. In the present embodiment, the first dried membrane 61a is made into a quasi-receiving plane, and the second dried membrane is formed on the quasi-receiving plane. In this method, since both end portions of the droplets 62 dropped on the projecting portion 9 are fixed to the first dried membrane 61a which is the quasi-receiving plane, there is no case where the droplets 62 greatly spread along the projecting portion as before, and separate to both sides of the projecting portion. Accordingly, even if a projecting portion exists, it is possible to form a continuous pattern.

After these processes end, the organic insulating membrane 7 is formed by baking the dried membrane in an oven. In the baking process, for example, the heating temperature is 180° C., and the heating time is 15 minutes. Although, in this process, the dried membrane 61a of the droplets 61 and the dried membrane of the droplets 62 are baked at one time, these membranes may be separately baked. For example, the droplets 62 may be dropped after the dried membrane 61a is baked.

In addition, in FIG. 6, the organic insulating membrane 7 is formed only on the outer peripheral portion of the active surface 3a. However, the invention is not limited thereto. It is possible that the organic insulating membrane 7 can be formed on the entirety of the active surface excepting the electrode terminals 5.

(3) Slope Forming Step

Figure 11A:
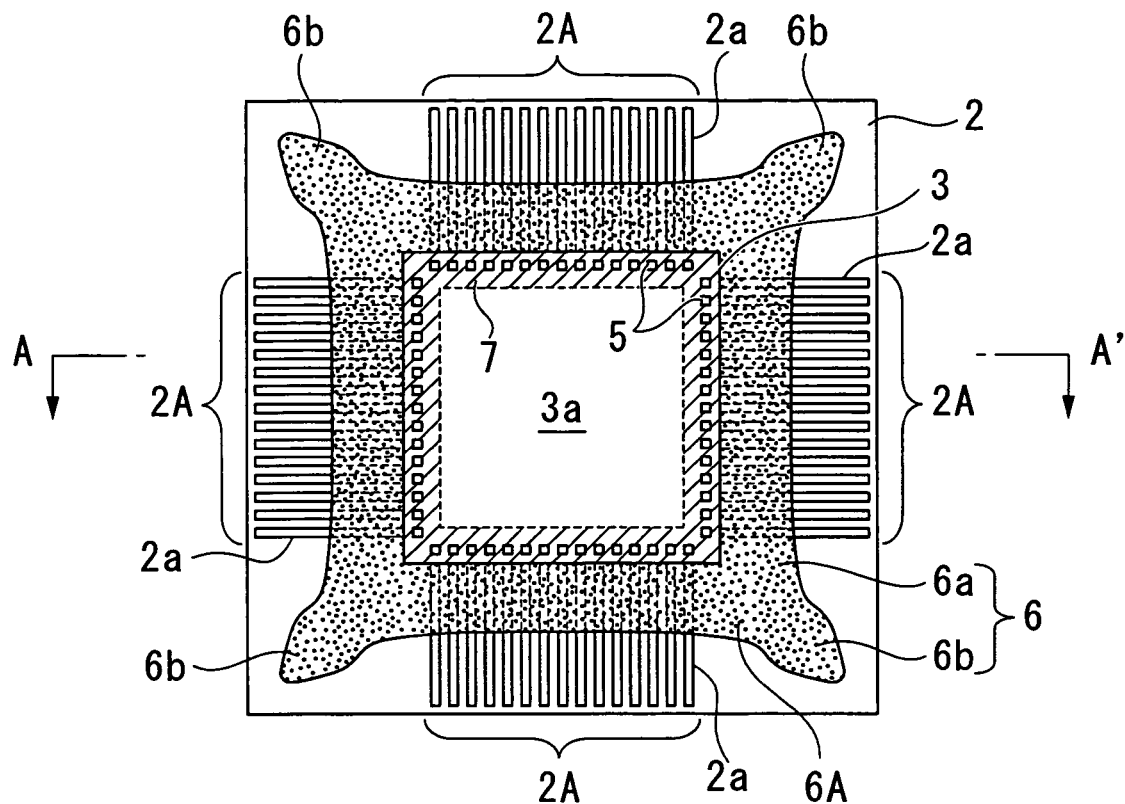
FIG. 11A and FIG. 11B are schematic views depicting states after slopes are formed.
Figure 11B:
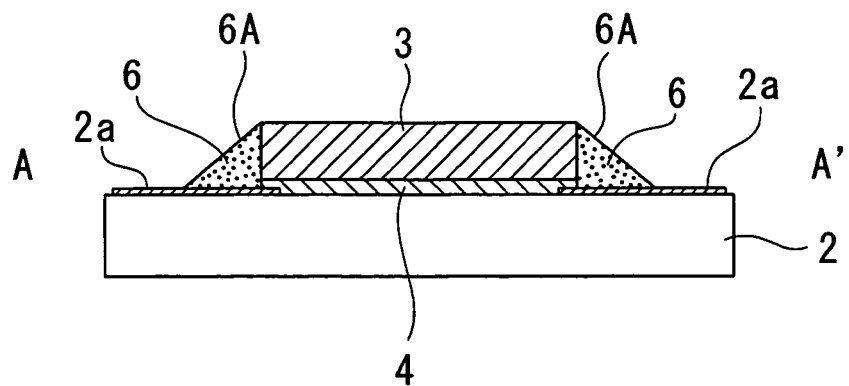

Next, a resin material is coated on the surrounding of the semiconductor chip 3, and a slope (inclined surface) 6A is formed so as to be connected from the surface of the wiring board 3 to the active surface 3*a* of the semiconductor chip 3 (refer to FIG. 11A and FIG. 11B). The slope 6A mitigates a difference in height of the projecting portion, resulting from the thickness (including the adhered layer) of the semiconductor chip 3, and is used to facilitate formation of the metallic wiring 8 thereafter.

In the process, it is necessary to form a slope without covering the electrode terminals 5 of the semiconductor chips 3 and without making any clearance or any steep difference from the active surface 3*a* of the semiconductor chips 3. A dispenser system which is able to accurately control the ejection quantity and ejection position of the resin material is employed in a method for coating the resin material.

As resin materials, for example, epoxy-type thermosetting resins can be used. The resin material is cured in a pre-baking process (90° C., 30 minutes) and post-baking process (150° C., 2 hours). Generally, the resin material is subjected to volume contraction in the thermal cure process. For this reason, in the present process, resin is coated two or three times in order to form a smooth slope from the active surface 3*a* to the surface of a wiring board. Where coating is carried out a plurality of times, a pre-baking process is carried out in respective coatings, and a post-baking process is carried out collectively.

Figure 10:
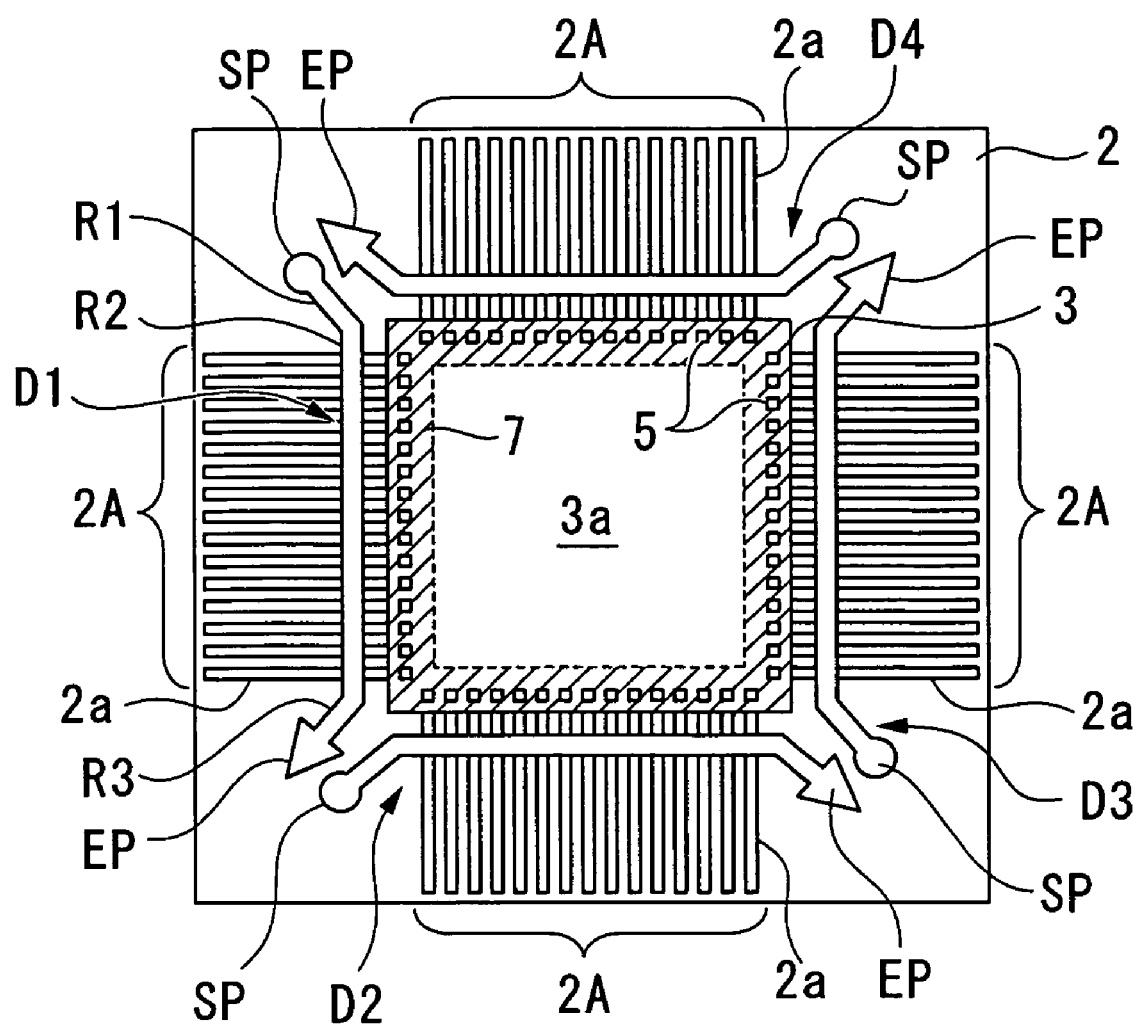
FIG. 10 is a schematic plan view depicting a slope forming step.

FIG. 10 is a plan view showing the coating process of a resin material. In FIG. 10, reference numerals D1 through D4 denote movement routes of a dispenser along respective edge sides of the semiconductor chip 3. Reference symbols SP and EP denote the ejection starting position and the ejection ending position of the dispenser in the respective movement routes, respectively. In the present embodiment, slopes 6A is formed separately for the respective edge sides of the semiconductor chip 3. Also, in the formation process of the respective slopes 6A, the ejection starting position SP and ejection ending position EP of the dispenser are established at positions apart from the semiconductor chip 3. A resin material for forming the slopes 6A is continuously ejected in the first route R1 from the ejection starting position SP toward the semiconductor chip 3, the second route R2 passing through the vicinity of the edge sides of the semiconductor chip 3, and the third route R3 from the semiconductor chip 3 toward the ejection ending position EP. In further detail, the ejection starting position SP and ejection ending position EP of the dispenser are arranged in a direction which becomes an obtuse angle from the corner portion of the semiconductor chip 3 to either of two edge sides including the corresponding corner portion. The ejection process of the resin material at the respective edge sides is continuously carried out along the first route R1 from the ejection starting position SP toward one corner portion of the corresponding edge side, the second route R2 from the above-described one corner portion toward the other corner portion along the corresponding edge side, and the third route R3 from the above-described other corner portion toward the ejection ending position EP located at the same side as the ejection starting position SP with respect to the corresponding edge side.

Where the slope 6A is formed at four sides of the semiconductor chip 3 by the dispenser system, it is possible for a desired shape of the slope 6A to be obtained by moving the nozzle of the dispenser while ejecting a resin material along the four sides of the semiconductor chip 3. However, since the viscosity of the resin material is high, the resin ejection is delayed when commencing resin ejection, and the ejection quantity becomes insufficient (the ejection starting point is delayed). Resin material in the nozzle is drawn by the ejected resin material when the resin ejection ends, and the ejection quantity is made excessive. Therefore, clearance is produced between the slope 6A and the end portion of the semiconductor chip 3 at a point where the ejection quantity is insufficient. Also, where the ejection quantity is excessive, such a problem is caused to be present, by which the resin material covers the electrode terminals 5. In this case, when attempting to solve the above-described problem by lowering the viscosity of the resin material, spread of the ejected resin material cannot be controlled, and a problem of covering the electrode terminals 5 results. In addition, the shape of the slope is not made smooth with a resin having a low viscosity, wherein a steep slope is formed.

Therefore, in the present embodiment, in order to solve the problem, the ejection starting position SP and the ejection ending position EP of the dispenser are set at a position apart from the semiconductor chip 3, and preparatory ejection is carried out through the route R1 from the ejection starting position SP to the vicinity of the chip and through the route R3 from the vicinity of the chip to the ejection ending position EP. According to the method, no shortage of the ejection and no excessive supply of the ejection occur in the vicinity (the second route R2) of the semiconductor chip 3, wherein a desired shape of slope 6A can be formed without fail. Also, in this process, the ejection starting position SP and the ejection ending position EP are disposed in a direction which become an obtuse angle to the corresponding edge side. For this reason, there is no case where the resin material ejected by the preparatory ejection covers the portions of the wiring patterns 2*a* of the wiring group 2A disposed at the periphery of the semiconductor chip 3. Further, since the slopes 6A are formed separately with respect to the respective edge sides, there is no case where the resin material enters into the corner portions of the edge sides as, for example, in a type of drawing with a single stroke of the brush, and the resin material covers the electrode terminals 5.

In addition, in the process, the preparatory ejection is carried out to solve a problem of ejection delay in the dispenser nozzle. For this reason, it is not necessary for the ejection quantity to be made excessive. Rather, by minimizing the ejection quantity (setting the ejection quantity to at least a smaller degree than that of regular ejection carried out along the edge sides of the semiconductor chip 3), it is preferable that the problem of covering the wiring patterns 2*a* and waste ejection be prevented.

Further, in the embodiment, as depicted in FIG. 10, the moving directions of the dispenser along the respective edge sides are set in the clockwise direction or the counterclockwise direction centered around the semiconductor chip 3. In this case, the ejection ending position EP with respect to one edge side and the ejection starting position SP with respect to the other edge side are disposed in proximity to each other in the vicinity of the respective corner portions of the semiconductor chip 3. As described above, the ejection quantity at the ejection starting position SP is apt to become insufficient while the ejection quantity at the ejection ending position EP is apt to become excessive. Provisionally, where a configuration differing from the present method is employed, that is, if the moving direction of the dispenser is set in the clockwise direction with respect to one edge side, and the moving direction of the dispenser with respect to the other edge side is set in the counterclockwise direction, only the ejection starting positions SP of both adjacent edge sides or only the ejection ending positions EP of both adjacent edge sides are arranged at the vicinity of the shared corner portion. Where only the ejection ending positions EP are located in proximity to each other, the resin material is made excessive at the corresponding portion, wherein there is a risk in that the wiring patterns 2a will be covered up. Where only the ejection starting positions SP are located in proximity to each other, portions in which only the ejection ending positions EP are located in proximity to each other are made at the other corner portions. A similar problem therefor occurs. In the contrast, with the method according to the present embodiment, since a resin material is provided at respective corner portions in almost the same quantity, no problems as described above occur.

Also, in the present process, there is no problem even if a coating process is carried out in all of the routes D1 through D4 first. Also, the order does not matter. In the present embodiment, for example, the coating is carried out in the order of D1, D3, D2 and D4.

FIG. 11A and FIG. 11B are plan views showing a state where the resin layer 6 that becomes a slope 6A has been formed.

In the present embodiment, the resin layer 6 includes a first resin layer 6a that is disposed along the edge sides of the semiconductor chip 3 and a second resin layer 6b protruding from the first resin layer 6a. The first resin layer 6a is formed by the ejection (that is, ejection through the second route R2) and is like a roughly rectangular frame shape along the edge sides of the semiconductor chip 3. The second resin layer 6b is formed by preparatory ejection (that is, ejection through the first route R1 and the third route R3) and is shaped so as to protrude from the corner portion of the first resin layer 6a in the direction that becomes an obtuse angle with respect to either one of two edge sides including the corresponding corner portion. The second resin layer 6b is provided at all the corner portions of the first resin layer. The second resin layer 6b is arranged so as to spread in four directions centering around the semiconductor chip 3. The resin layer 6 according to the embodiment assumes the role of a fixing layer for the semiconductor chip 3 to the wiring board 2 in addition to the role of providing a slope to form metallic wiring 8. If the resin layer 6 is formed just like drawing with a single stroke of a brush, the formed resin layer 6 becomes only the first resin layer 6a. In comparison therewith, in the present embodiment, since the second resin layer 6b is formed by the preparatory ejection, the fixing force of the chip is accordingly intensified. In addition, since the first resin layer 6a and the second resin layer 6b are made roughly symmetrical with each other centering around the semiconductor chip 3, influence of the resin layer 6 on the semiconductor chip 3 is made uniform.

(4) Metallic Wiring Forming Step

Figure 12A:
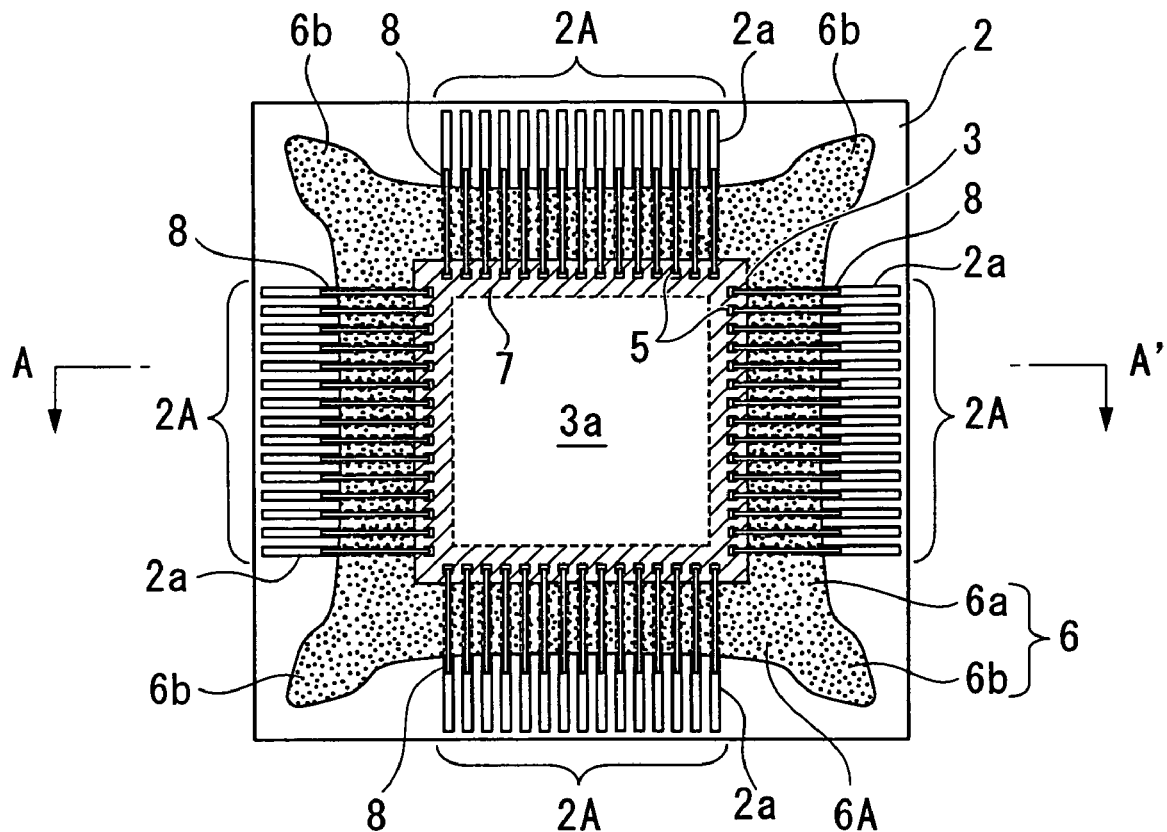
FIG. 12A and FIG. 12B are schematic views depicting states after a metallic wiring forming step.
Figure 12B:
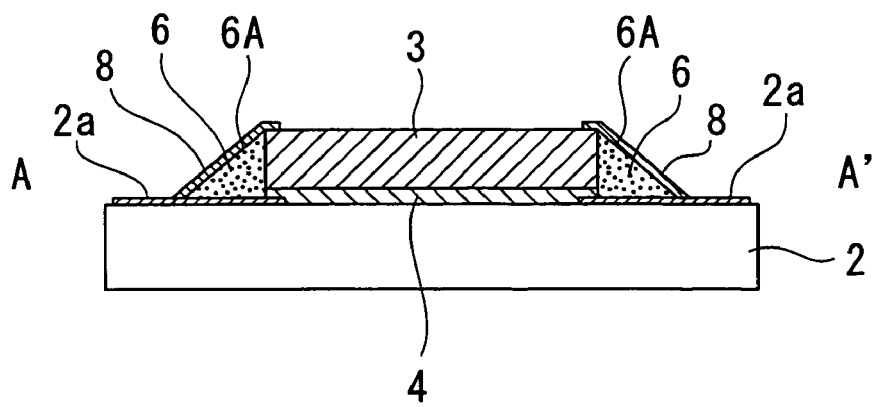

Next, as depicted in FIG. 12A and FIG. 12B, metallic wiring 8 is formed on the slope 6A and the surface of the organic insulating membrane 7 by liquid ejection method. The metallic wiring 8 is connection wiring to connect the electrode terminals 5 secured on the active surface 3a to the wiring pattern 2a secured on the wiring board 2.

In the present embodiment, first, the surface of the organic insulating membrane 7 and the surface of the resin layer 6 (the surface of the slope 6A) are made liquid affinity as a preprocess. In the process, it is preferable that the contact angle of droplets on the organic insulating membrane 7 and on the resin layer 6 to the metallic ink be less than 90°, more preferably, 60° through 30°. Also, if the organic insulating membrane 7 is in the above-described contact angle without any liquid affinity imparting process, such a process is not required.

Next, droplets (metallic ink) including conductive particles are ejected through the droplet ejection head, and are dropped on a place where the metallic wiring 8 should be formed, that is, a predetermined area (membrane-forming area) from the electrode terminals 5 to the wiring pattern 2a. In this process, an apparatus similar to the above-described droplet ejection apparatus 210 may be used.

Silver may be preferably used for the conductive particles. In addition thereto, metallic particles including gold, copper, palladium, nickel, and particles of conductive polymer and superconductor may be used. An organic substance may be coated on the surface of the conductive particle in order to improve the dispersibility. For example, a polymer that can induce steric hindrance and electrostatic repulsion may be listed as a coating material to be coated on the surface of the conductive particles. Also, it is preferable that the particle size of the conductive particles be 5 nm or more but less than 0.1 μm. If the particle size exceeds 0.1 μm, the nozzle is likely to become clogged. It therefore becomes difficult for the droplet ejection head to eject droplets. Further, if the particle size is less than 5 nm, the volume ratio of the coating agent to the conductive particle is increased, and the ratio of organic substances in the obtained membrane is made excessive.

The dispersion medium to be used is not specially limited as long as it is able to disperse the above-described conductive particles and does not result in any aggregation. In addition to water, the following may be listed as dispersion media: alcohol such as methanol, ethanol, propanol, buthanol, etc., carbohydrate compounds such as n-heptane, n-octane, decane, toluene, xylene, cymene, durene, indene, dipentene, tetrahydronaphthalene, decahydronaphthalene, cyclohexyl-benzene, etc., and ether compounds such as ethyleneglycol-dimethylether, ethyleneglycoldiethylether, ethyleneglycolmethylethylether, diethyleneglycoldimethylether, diethyleneglycoldiethylether, diethyleneglycolmethylethylether, 1,2-dimethoxyethane, bis(2-methoxyethyl)ether, p-dioxane, etc., and further, polar compounds such as propylene carbonate, γ-butyrolactone, N-methyl-2-pyrrolidone, dimethylformamide, dimethylsulfoxide, cyclohexanone, etc. Among these compounds, water, alcohol, carbohydrate compounds, and ether compounds are preferable in view of dispersibility of particles, stability of dispersion liquid L2 and applicability to the droplet ejection system. Water and carbohydrate compounds may be listed as a particularly favorable dispersion media. These dispersion media may be used independently or in the form of a mixture of two or more compounds.

Figure 13A:
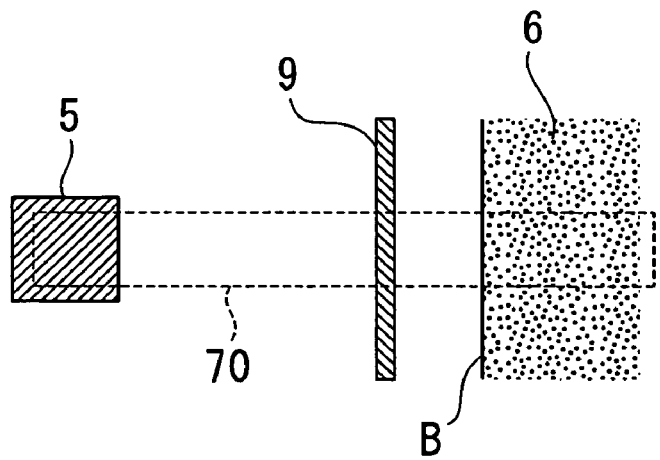
FIG. 13A, FIG. 13B and FIG. 13C are schematic plan views depicting a metallic wiring forming step.

FIGS. 13A to 13C and FIGS. 14A to 14C are views showing droplet disposing processes. FIG. 13A is a plan view schematically showing the vicinity of an electrode terminal 5. In this drawing, reference numeral 70 denotes a linear membrane forming area in which a membrane pattern is formed, and reference symbol B denotes a boundary portion between the semiconductor chip 3 and the resin layer 6. On the either side of the boundary portion B, the surface property of the ejection surface on which the droplets are ejected differs. Also, the guard ring 9 which is a projecting portion is arranged between the boundary portion B and the electrode terminals 5. In the process, a continuous linear membrane pattern is formed over the guard ring 9 and the boundary portion B.

In the embodiment, when forming the metallic wiring 8, in order to form a membrane pattern further free from any constriction, which has a uniform line width, ejection of droplets is carried out three times. The first process and the second process are processes for forming an under-layered membrane pattern which is continuous in the membrane forming area 70, and the third process is a process for plotting an upper-layered membrane pattern on the under-layered membrane pattern by overlapping.

Figure 13B:
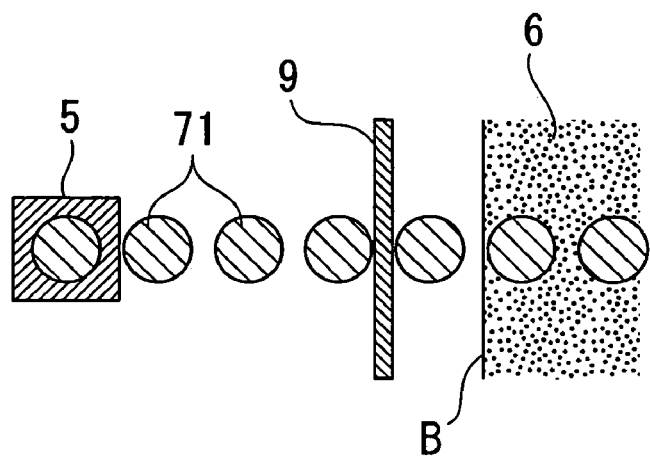
Figure 13C:
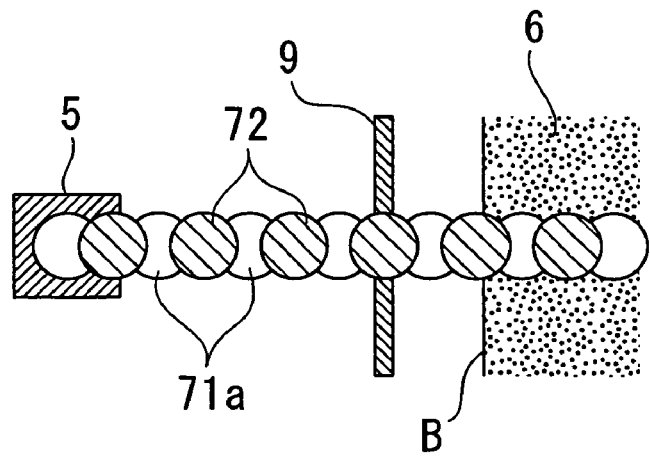

First, in the first process, as depicted in FIG. 13B, a plurality of droplets 71 are dropped while spacing then from each other so as not to allow contact with each other. At this time, the droplets 71 are dropped while avoiding the guard ring 9 and the boundary portion B so that the droplets are not applied thereonto. Next, the droplets 71 are dried to form a plurality of first dried membranes (the first membrane pattern) 71a which are like dots. Next, as depicted in FIG. 13C, droplets 72 are dropped so as to fill between the first dried membranes 71a as the second process. At the guard ring 9 and the boundary portion B, droplets 72 are dropped so as to overlap the dried membranes 71a forward and backward of the guard ring 9 and the boundary portion B, extended over the same. When overlapping droplets on droplets, since the upper-layered side droplets are apt to be fixed to the landing position, the droplets 72 in the second time are process into a state where both sides thereof are fixed, wherein the droplets will not greatly spread along the projecting portion and the boundary portion B. Therefore, a membrane pattern whose droplet size is minute is formed on the guard ring 9 and the boundary portion B. Further, since the droplets 71 of the first time are turned into the dried membrane 71a, no liquid bulge is formed by contact of the droplets 72 in the first process with those in the second process. A line width responsive to the size of the dropped droplets is formed.

Figure 14A:
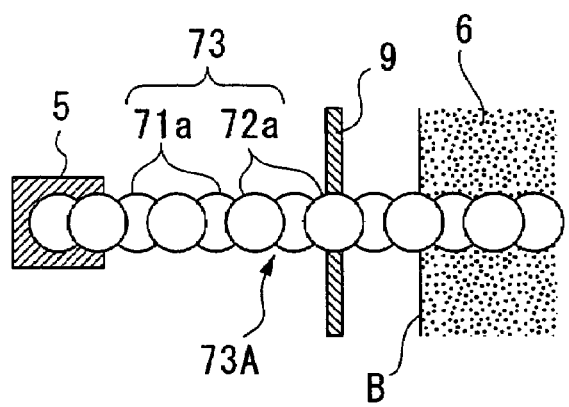
FIG 14A, FIG. 14B and FIG. 14C are schematic plan views depicting a metallic wiring forming step.
Figure 14B:
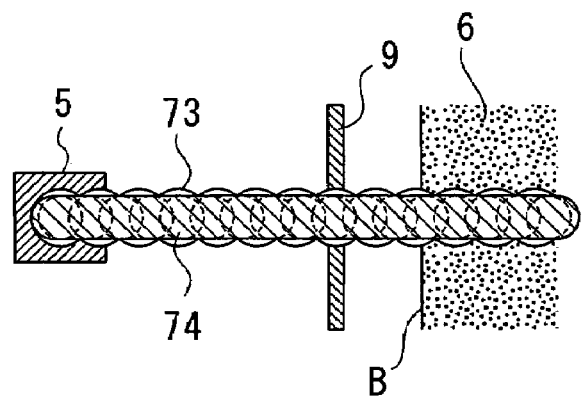

After dropping the droplets 72, the droplets 72 are dried and are turned into the second dried membrane (the second membrane pattern) 72a. FIG. 14A is a view showing a state where the dried membrane 72a has been formed. The dried membrane 72a is disposed so as to extend over the previous dried membranes 71a. With the dried membranes 71a and 72a, a linear under-layered membrane pattern 73, which is continued like dots, is formed on the membrane forming area 70. The under-layered membrane pattern 73 is a base pattern of the metallic wiring 8. In the above-described process, since the ejected droplets are dried as they are, phase boundaries and constrictions 73A corresponding to the shape of the droplets are produced at the joined portions of the respective dried membranes 71a and 72a in the obtained under-layered membrane pattern 73. For this reason, where the under-layered membrane pattern 73 is baked as it is, and is turned into the metallic wiring 8, there is a possibility that the phase boundaries and constrictions 73A will adversely influence the electric resistance and high frequency characteristics. Therefore, in the present embodiment, as depicted in FIG. 14B, droplets 74 are further dropped onto the under-layered membrane pattern 73 as the third process, thereby forming the upper-layered pattern. Since the dropped droplets 74 are satisfactorily fixed to the under-layered membrane pattern 73, no bulge is produced even if the droplets are continuously dropped so as to be brought into contact with each other. In addition, the constriction 73A and phase boundaries of the under-layered membrane pattern 73 are removed by the droplets 74, and the droplets 74 are dried and are turned into the upper-layered pattern 75, and a membrane pattern, substantially free from constriction as in FIG. 14C, which has a uniform line width can be formed.

After these processes are finished, the dried membrane is baked in an oven, and metallic wiring 8 is formed. The baking process is carried out at, for example, 200° C., for two hours as the heating time. Also, although, in the baking process, the under-layered membrane pattern 73 and the upper-layered membrane pattern 75 are baked at one time, the patterns 73 and 75 may be separately baked. For example, droplets 72 may be dropped after the under-layered membrane pattern 73 is baked.

Figure 14C:
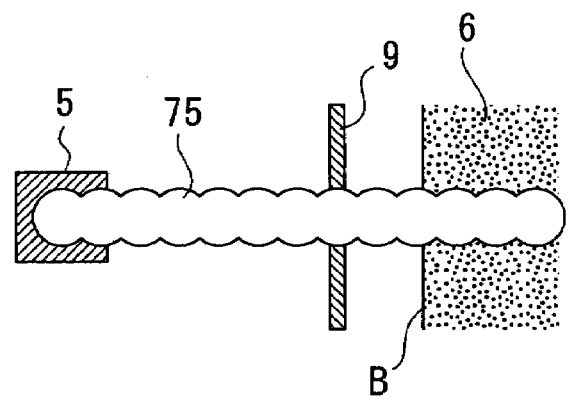
Figure 15:
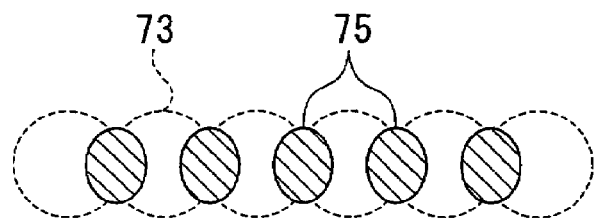
FIG. 15 is a schematic plan view depicting another example of the metallic wiring forming step.

Further, in FIG. 14C, the upper-layered membrane pattern 75 is formed as a pattern that continuously covers up the entire surface of the under-layered membrane pattern 73. However, the process is not necessarily so limited. For example, as depicted in FIG. 15, droplets 74 may be dropped at the portions of the joint (that is, the constriction portions) between the dried membrane 71a and the dried membrane 72a, and a plurality of intermittent upper-layered membrane patterns 75 may be formed on the corresponding portions, whereby at least constrictions of the membrane pattern can be removed.

Also, in the present embodiment, droplets are ejected in the first process and the second process so that the droplets are not brought into contact with each other, in order to prevent any bulge from occurring. However, since bulge is permitted in a range by which membrane patterns (metallic wiring) adjacent to each other are not brought into contact with each other, it is possible to continuously drop droplets by several drops at once in these processes. In this case, it is necessary that the number of drops that are continuously dropped is set to a number by which, when the corresponding droplets are continuously disposed, the width of a liquid-like membrane formed by the dropped droplets becomes less than the pitch (in this process, the array pitch of the metallic wiring 8 that is a linear-shaped pattern) of the object membrane pattern. Where a pattern is formed by thus continuously linking a plurality of droplets together, a somewhat wide linear-shaped pattern is formed.

(5) Packaging Step

After the metallic wiring 8 is formed, the surface on which semiconductor chips 3 of the wiring board 2 are mounted is molded as necessary. Soldering balls are mounted on the rear side of the wiring board 2. Subsequently, the board is cut off after a reflow process, a rinsing process and sheet-adhering process are finished, and is made into chips.

The above completes production of the IC 12.

As described above, in the present embodiment, the face-up mounting system is employed as the method for mounting semiconductor chips 3 on a wiring board 2, and the method for connection using metallic wiring 8 formed by the droplet ejection system is employed as the wiring connection method instead of the conventional wire-bonding method. Therefore, in comparison with the conventional wire-bonding method, stress applied to the semiconductor chips 3 can be relieved. In addition, it is possible to optionally re-route (relocate) the wires by the metallic wiring 8, and it is possible to employ further inexpensive universal substrates.

Also, in the present embodiment, since an organic insulating membrane 7 formed of epoxy-resin and urethane resin, etc., is formed prior to forming metallic wiring 8, metallic wiring 8 having satisfactory adhesibility can be formed. Also, since the fixation of droplets is improved, short-circuiting between wires due to excessive spread of the droplets because of a projecting surface such as, for example, a guard ring, etc., can be prevented from occurring.

Figure 22A:
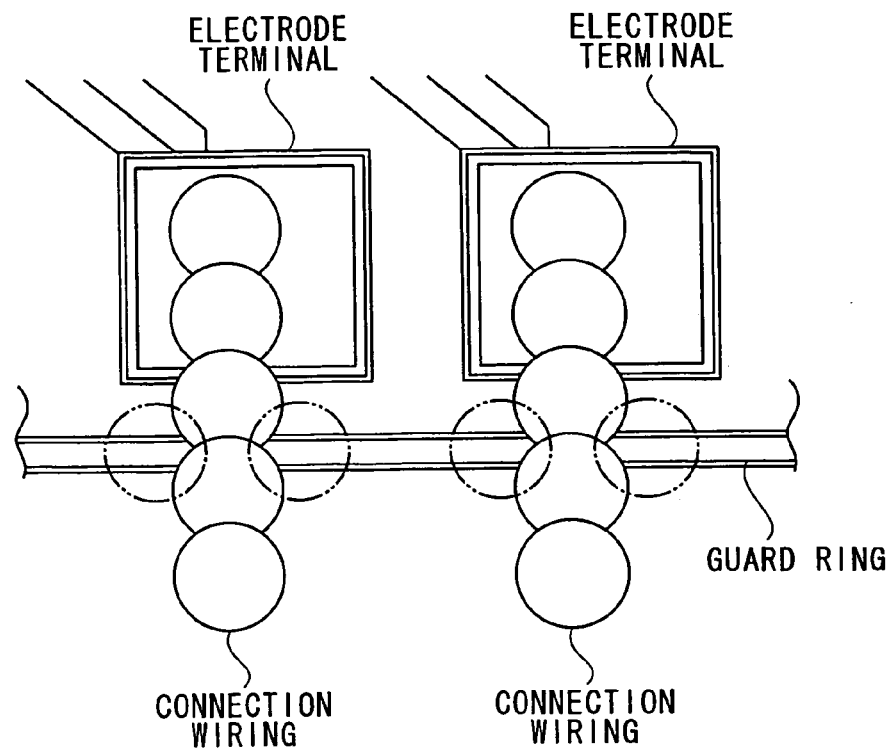
FIG. 22A and FIG. 22B are views depicting situations of metallic wiring (connection wiring) in the vicinity of a guard ring.
Figure 22B:
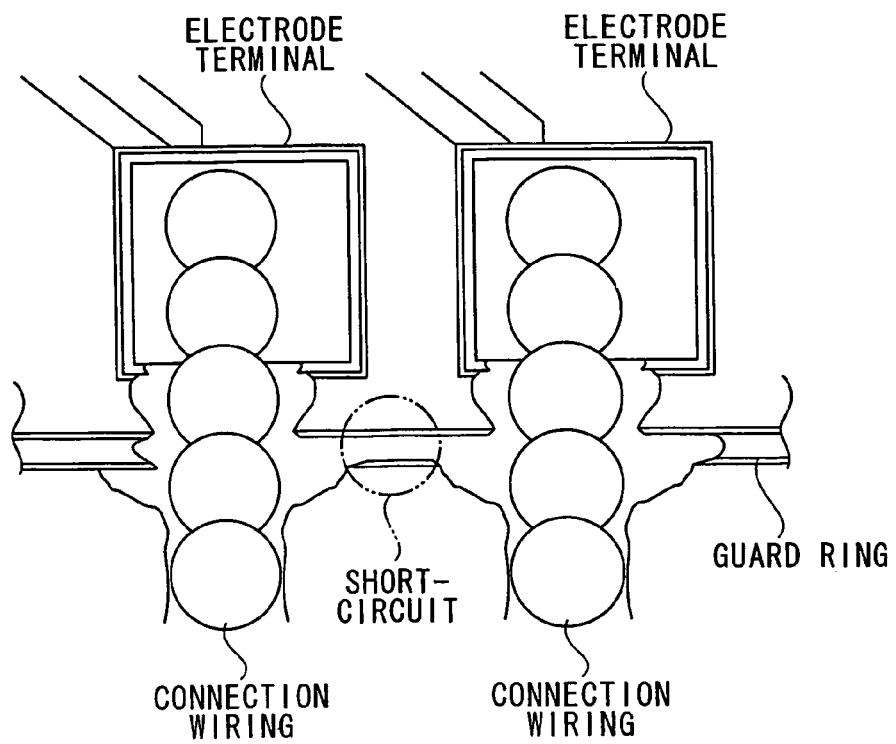

FIG. 22A and FIG. 22B are views showing situations of the metallic wiring in the vicinity of the guard ring. FIG. 22A is a view (an example of the method according to the present embodiment) showing situations of the metallic wiring in a case where the organic insulating membrane 7 is formed as an under-layered membrane, and FIG. 22B is a view showing situations of the metallic wiring in a case where wiring is plotted directly on the surface of a passivation membrane such as $SiO_2$, etc., without forming any organic insulating membrane 7. In FIG. 22B, droplets spread via the projecting surface of the guard ring, and the metallic wirings are short-circuited at the point surrounded by a circle. In contrast, in FIG. 22A, spread of the droplets is suppressed in the range of the portion surrounded by a circle in the drawing, and the metallic wiring has been formed with a uniform line width.

Also, since, in the present embodiment, the metallic wiring 8 is formed by overlapping the upper-layered membrane pattern 75 on the under-layered membrane pattern 73, uniform wiring having fewer constrictions and phase boundaries can be formed. Further, since droplets are ejected with projections and gaps taken into consideration when forming the organic insulating membrane 7 and metallic wiring 8, it is possible to accurately form even membrane patterns of a minute shape without producing disconnection of wires and bringing about any short-circuit.

Also, in the present embodiment, when forming the slope 6A, the ejection starting position SP and the ejection ending portion EP are set at a position away from the semiconductor chips 3, and preparatory ejection is carried out in the route R1 from the ejection starting position SP to the vicinity of the semiconductor chip 3 and in the route R3 from the vicinity of the semiconductor chip 3 to the ejection ending position EP. For this reason, no shortage in ejection occurs in the vicinity (route R2) of the semiconductor chip 3, and it is possible to securely form a slope 6A of a predetermined shape.

In addition, since the second resin layer 6b formed by the preparatory ejection is arranged avoiding the wiring group 2A, there is no case where any inconvenience occurs when forming the metallic wiring 8. Rather, it advantageously functions in fixing the semiconductor chip 3 to the wiring board 2 together with the first resin layer 6a.

Also, in the present embodiment, when joining the semiconductor chip 3 and the wiring substrate 2 together, the adhesive agent 4 is made into spheres with small diameters and a plurality of adhesive agents 4 are disposed on the joining portion, and the adhesive layer is formed by spreading the adhesive agent 4 by pressurizing the same. Therefore, a thinner adhesive layer than in the related arts can be formed. Accordingly, when forming the slope 6A, a tapered slope which is gently inclined can be formed.

As described above, a description was given of preferred embodiments according to the invention with reference to the accompanying drawings. However, needless to say the present invention is not limited to such examples described above. Various shapes of respective components and combinations thereof, which are described above, are only examples, and such shapes and combinations of the respective components may be subjected to various modifications based on design requirement in the range not departing from the spirit of the invention.

For example, in the present embodiment, the semiconductor chip 3 was listed as an example of an electronic element according to the present invention. The electronic element is not so limited. An element other than the semiconductor element, for example, a capacitor, a resistor, etc., may be used. In addition, in the production steps (1) to (5) described above, the order thereof may be partially changed as long as there is no inconsistency in the steps. For example, the insulative ink processing step of (2) and the slope forming step of (3) may be interchanged. Further, the present embodiment is constructed so that the wiring pattern 2a is disposed at all the edge sides of the semiconductor chip 3. However, the invention is not limited thereto. For example, the wiring pattern 2a may be disposed at, for example, two or three edge sides.

Also, the embodiment is constructed so that a bare chip is packaged to be an IC 12 and is mounted on a film substrate 11. However, the bare chip may be mounted directly on the film substrate 11 with the bare chip not made into a package. In this case, the film substrate 11 may become a wiring board of the present invention.

With respect to the (1) die-bonding step, (2) insulative ink processing step, (3) slope forming step, (4) metallic wiring forming step, and (5) packaging step of the bare chip which is an electronic element, steps similar to those described above may be employed.

Further, in the embodiment, the step of forming metallic wiring 8 is divided into a step of forming the under-layered membrane pattern 73 and a step of forming the upper-layered membrane pattern 75. This is because, by forming the under-layered membrane pattern 73, the fixation property of droplets is improved when forming the upper-layered membrane pattern 75. The same situation can be brought about by turning the surface of the board, on which droplets are disposed, into a reception surface or a rough surface. Herein, the reception surface is a surface which absorbs liquid contents, and is composed of a porous surface internally including minute pores or an organic surface which absorbs liquid contents. The rough surface is a plane having minutely receded and projecting parts formed on the surface thereof and is composed so as to absorb liquid contents by an action similar to that of the porous surface. Such a reception surface or a rough surface presents remarkably satisfactory liquid affinity and absorbs liquid contents of the droplets. Droplets supplied on these surfaces are satisfactorily retained on the corresponding surfaces. Therefore, there is no case where liquid contents remain on the other areas (that is, areas in which no droplets are dropped) of the substrate. Thus, by disposing droplets on the reception surface or rough surface and forming a membrane pattern, a membrane pattern of minute shape can be accurately formed with wires not disconnected and no short-circuits brought about.

Embodiment 2

Next, a description is given of Embodiment 2 of the invention.

The point on which Embodiment 2 differs from Embodiment 1 resides in the step of joining a semiconductor chip 3. Therefore, a description is given herein only of the corresponding step. Also, in the present embodiment, the members and portions that are similar to those of Embodiment 1 are given the same reference numerals, and detailed descriptions thereof are omitted.

Figure 16A:
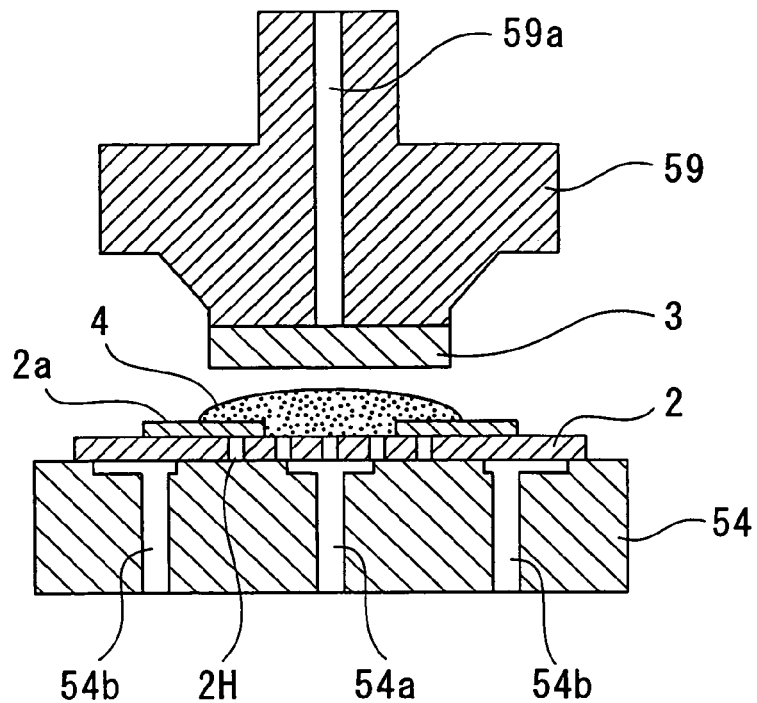
FIG. 16A and FIG. 16B are schematic sectional views depicting a die-bonding process according to Embodiment 2.
Figure 16B:
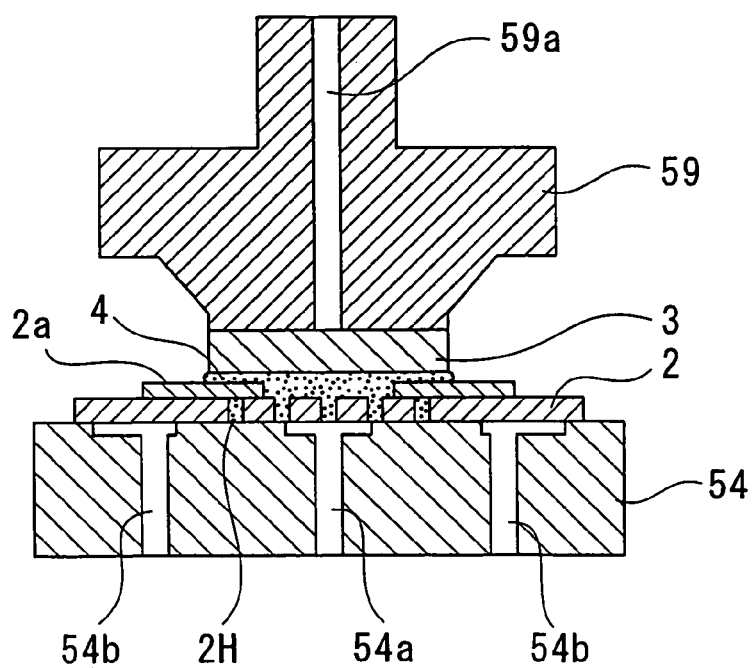

FIG. 16A and FIG. 16B are views showing a step of joining a semiconductor chip 3 according to the present embodiment.

In Embodiment 1, in order to make the thickness of the adhesive layer lower, the adhesive agent 4 is made into spheres with small diameter and is dispersed and disposed in the joining portion. However, in the present embodiment, the adhesive agent 4 is not made smaller in diameter but the agent is disposed as a lump. A through-hole 2H is formed in the wiring board 2, and an excess of the adhesive agent is ejected into the through-hole 2H. The adhesive agent 4 is ejected to the rear side of the wiring board 2 via the through-hole 2H when being pressurized by a heating/pressing tool 59. At this time, in order to smoothly carry out the ejection, the adhesive agent may be suctioned by suctioning means (for example, suctioning holes 54a and 54b) disposed on the rear side of the wiring board 2. According to the method, even if the adhesive agent 4 is provided excessively, the excess of the adhesive agent 4 is ejected to the rear side of the wiring board 2 via the through-hole 2H. Therefore, the excess thereof does not contribute to an increase in the thickness of the adhesive layer. Accordingly, a thinner adhesive layer than in the related art can be formed.

Figure 17A:
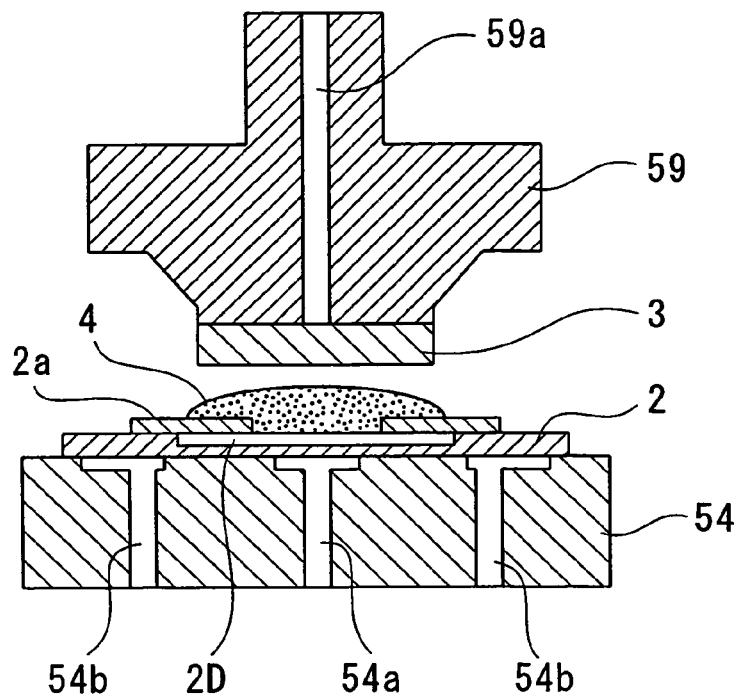
FIG. 17A and FIG. 17B are schematic sectional views depicting another die-bonding process.
Figure 17B:
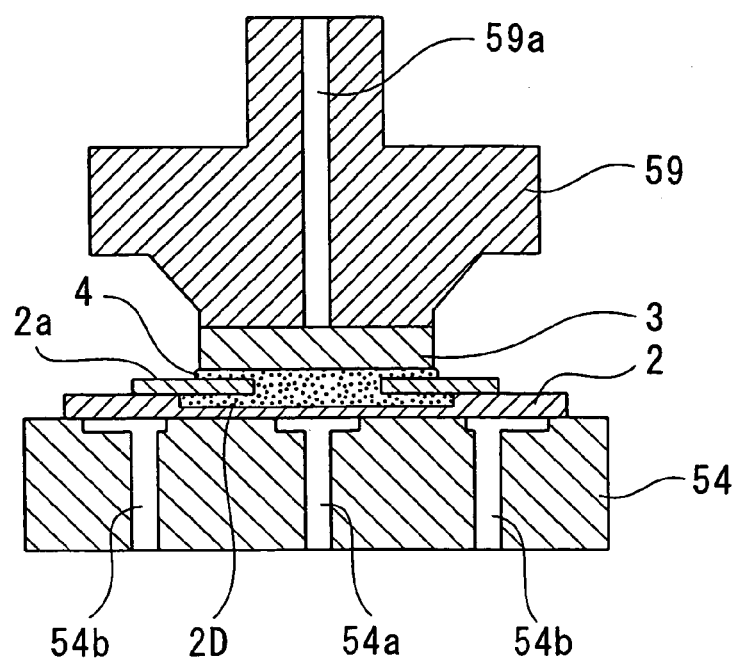

FIGS. 17A and 17B are views showing another step of joining a semiconductor chip 3 according to the present embodiment.

In the present embodiment, a recess portion 2D is formed in the wiring board 2. An excess of the adhesive agent 4 is ejected into the recess portion 2D. That is, in the embodiment, the semiconductor chip 3 is adhered while letting an excess of the adhesive agent 4 escape into the recess portion 2D. Therefore, even if the adhesive agent 4 is provided excessively, the excess of the adhesive agent 4 is accommodated in the recess portion 2D, and it does not contribute to an increase in the thickness of the adhesive layer.

Figure 18A:
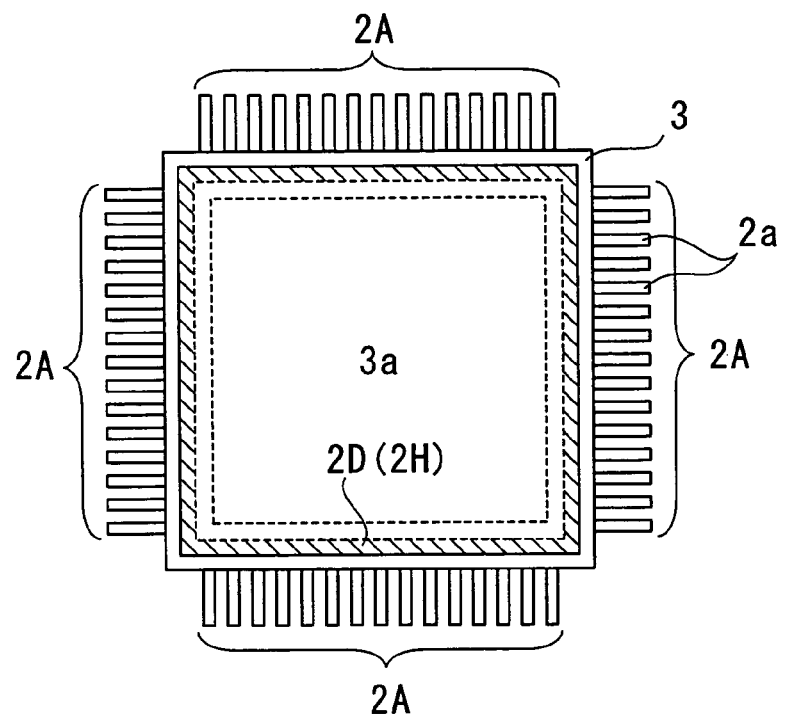
FIG. 18A and FIG. 18B are schematic plan views depicting the positions where concave portions and through-holes are formed.
Figure 18B:
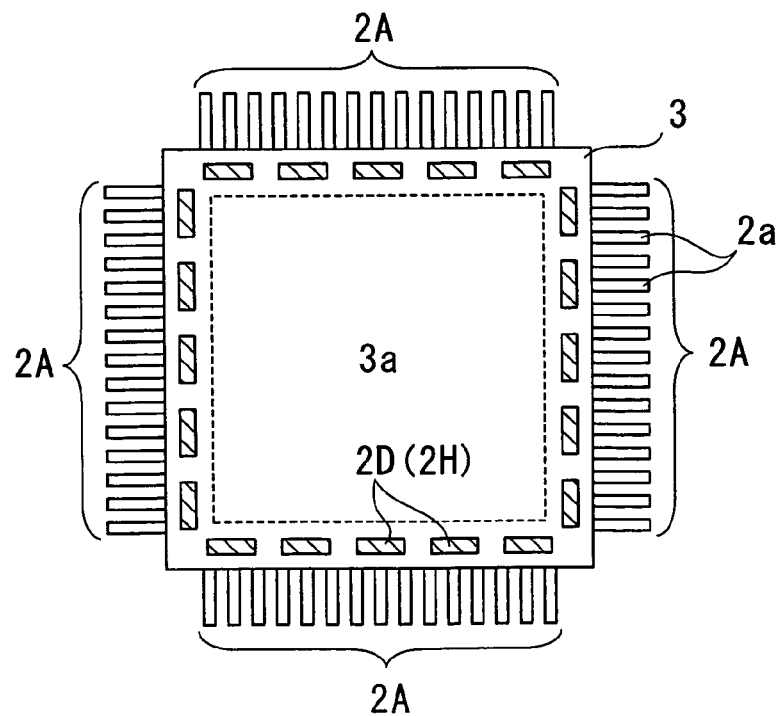

It is preferable that the through-hole 2H depicted in FIGS. 16A and 16B and the recess portion 2D depicted in FIGS. 17A and 17B be disposed in the vicinity of the outer periphery of the semiconductor chip 3. Normally, in the semiconductor chip 3, a circuit portion is formed at the central portion thereof, and electrode terminals are formed at the outer peripheral portion thereof. Therefore, in order to suppress influence of the adhesive agent as much as possible, it is preferable that positions of the through-hole 2H and recess portion 2D, where the adhesive agent 4 is provided more than in the other portions, be disposed at the outer peripheral portion of the semiconductor chip 3, in which the electrode terminals are formed. In detail, as depicted in FIG. 18A and FIG. 18B, such a structure may be employed, in which one or a plurality of the above-described through-holes 2H and recess portions 2D are annularly disposed along the outer periphery of the semiconductor chip 3. Also, such a structure may be employed, in which the through-hole 2H and recess portion 2D are concurrently used.

Embodiment 3

Next, a description is given of Embodiment 3 according to the present invention.

The point on which Embodiment 3 differs from Embodiment 1 resides only in the slope forming step. Therefore, a description is given only of the corresponding step. In addition, in the present embodiment, the members and portions which are similar to those of Embodiment 1 are given the same reference numerals, and detailed descriptions thereof are omitted.

Figure 19:
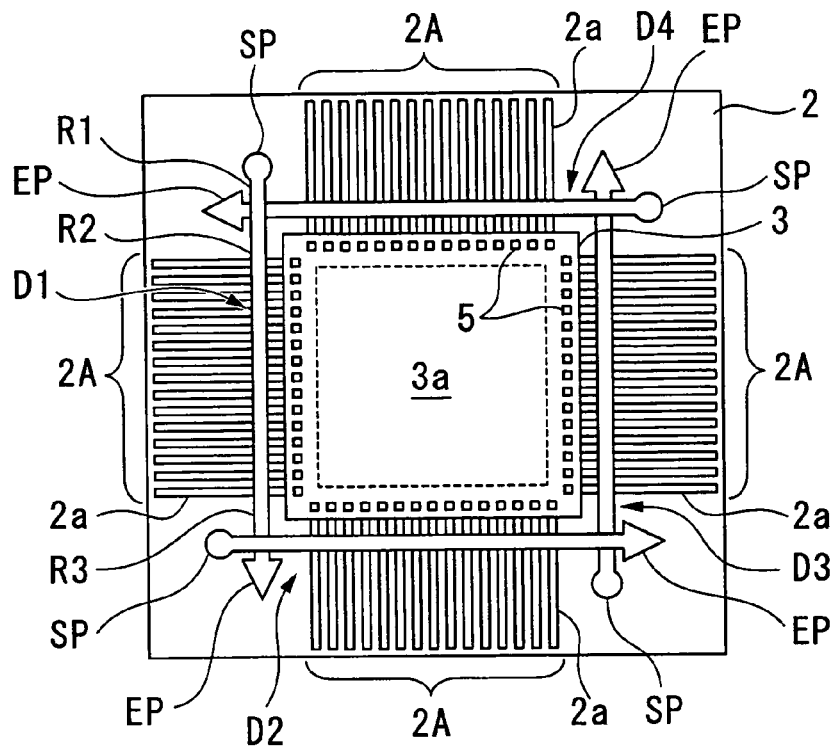
FIG. 19 is a schematic plan view depicting a slope forming step according to Embodiment 3.

FIG. 19 is a view showing a slope forming step according to the present embodiment.

In Embodiment 1, the ejection starting position SP and the ejection ending position EP of the dispenser are disposed at a position obliquely deviated from the corner portions of the semiconductor chip 3 to the corresponding edge sides, and the routes R1 and R3 related to preparatory ejection are made into routes bent with respect to the route R2 related to regular ejection. In contrast, in the present embodiment, these routes R1 through R3 are straight. This method may be utilized where the wiring pattern 2a is not disposed to the extreme edge side of the semiconductor chip 3.

In the method, as in Embodiment 1, it is preferable that the moving directions of the dispenser along respective edge sides be set to be in the clockwise direction or counterclockwise direction centered around the semiconductor chip 3, whereby it is possible to prevent portions having a greater amount of resin and a smaller amount thereof from being lopsidedness.

Figure 20:
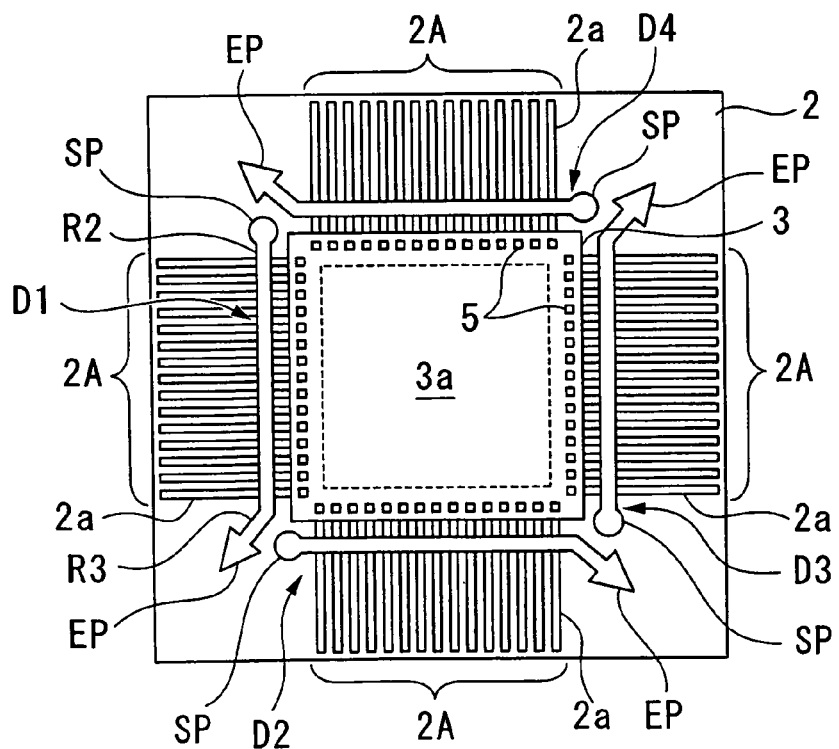
FIG. 20 is a schematic plan view depicting another slope forming step.

FIG. 20 is a view showing another slope forming step according to the present embodiment.

In the embodiment, the ejection starting positions SP of the dispenser are disposed in the vicinity of the corner portions of the semiconductor chip 3. In this case, in the vicinity of the ejection starting positions SP, there is a tendency for the ejection amount of a resin material to be reduced. Therefore, with this embodiment, in the coating process of a resin material to the respective edge sides, the moving directions of the dispenser at all the edge sides are set to be in the clockwise direction or the counterclockwise direction centered around the semiconductor chip 3. According to this method, since both the ejection starting position SP at one edge side and the ejection ending position EP at the other edge side are arranged at respective corner portions of the semiconductor chip 3, the portion where a shortage in the ejection occurs in the coating process with respect to one edge side is compensated by the portion where an excess of ejection occurs in the coating process with respect to the other edge side. Therefore, uniform coating can be carried out along the respective edge sides.

Further, although, in the present embodiment, the ejection starting position SP is disposed in proximity to the semiconductor chip 3, and the ejection ending position EP is disposed away from the semiconductor chip 3, the inverted structure thereof may be employed.

Also in this case, by employing the coating a similar method, the same effects can be obtained.

Further, in the present embodiment, it is preferable that one of the ejection starting position SP and the ejection ending position EP of the dispenser, which is set away from the semiconductor chip 3, be arranged in a direction that becomes an obtuse angle with respect to two edge sides including the respective corner portions of the semiconductor chip 3 from the corresponding corner positions. Accordingly, it is possible to avoid interference with the wiring group 2A.

-Electronic Instrument-

Figure 21:
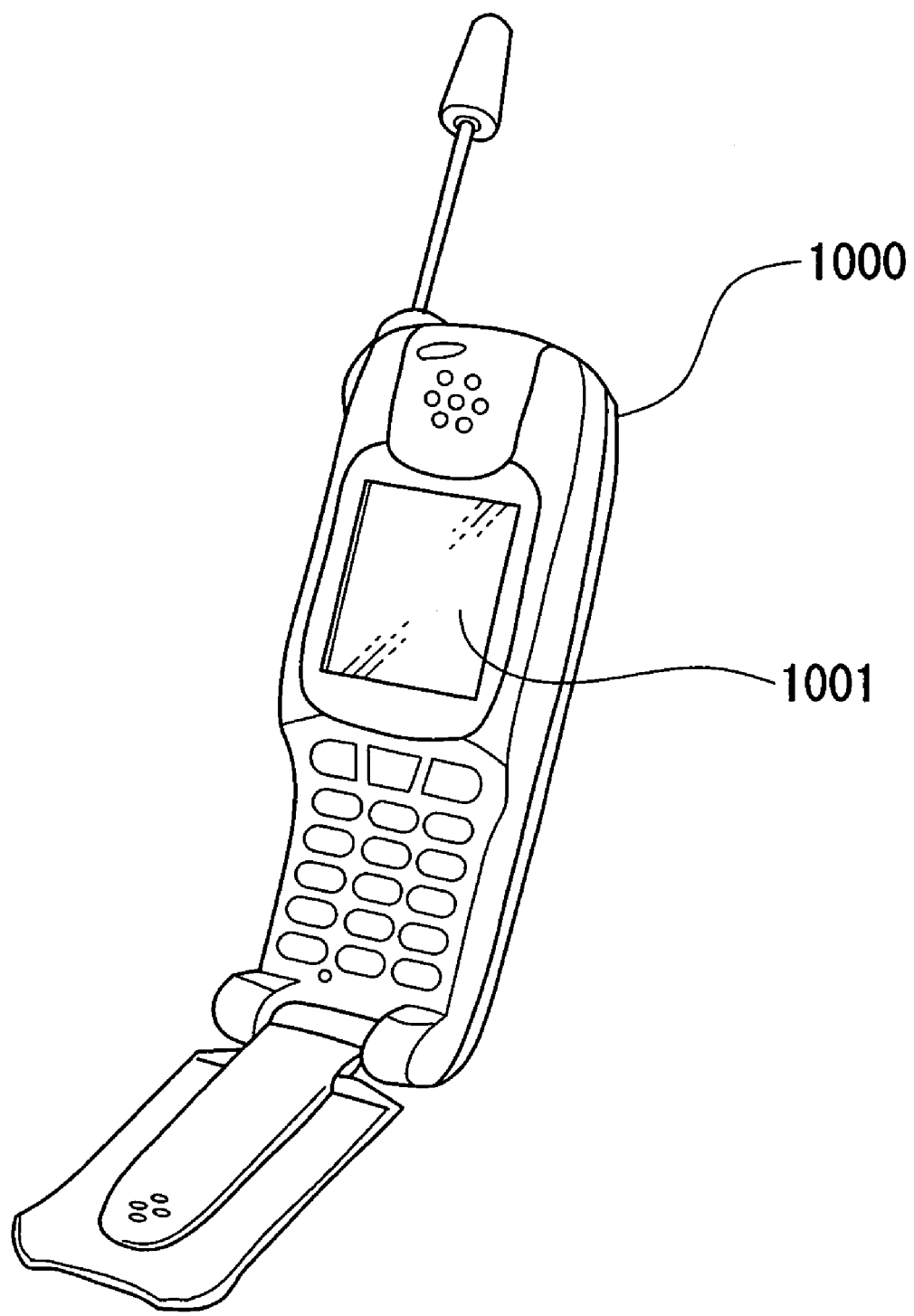
FIG. 21 is a perspective view of a mobile telephone which is one example of an electronic device.

Next, a description is given of an electronic instrument provided with an electronic device or a circuit board according to the present embodiment, using FIG. 21. FIG. 21 is a perspective view of a mobile telephone. In FIG. 21, reference numeral 1000 denotes a mobile telephone, and 1001 denotes a display portion. The display portion 1001 of the mobile telephone 1000 is provided with an electro-optical unit (for example, the above-described liquid crystal display apparatus) including an electronic device or a circuit board according to the present embodiment. Therefore, it is possible to provide a small-sized mobile telephone 1000 having excellent reliability in electric connections.

The present invention is not limited to the above-described mobile telephone. The invention can preferably be used as image displaying means of electronic devices such as, for example, an electronic book, a personal computer, a digital still camera, a liquid crystal television set, a view-finder type or a monitor direct-sight type video tape recorder, a car navigation unit, a pager, an electronic notebook, an electronic calculator, a word processing machine, a work station, a television telephone, a POS terminal, a touch panel, etc. In any case, it is possible to provide a small-sized electronic device having excellent reliability in electrical connections.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A method for mounting an electronic element on a wiring board, the electronic element including an active surface and side walls, the method comprising:
    disposing the electronic element on a surface of the wiring board so that the side walls of the electronic element form a substantially perpendicular angle with the surface of the wiring board;
    forming an organic insulating membrane on the active surface of the electronic element;
    ejecting a material to fill in an area between the side walls of the electronic element and the surface of the wiring board to form an inclined surface connected from a surface of the wiring board to the active surface of the electronic element at peripheries of the electronic element; and
    forming connection wiring for connecting electrode terminals secured on the electronic element to a wiring pattern secured on the wiring board on the inclined surface and the surface of the organic insulating membrane by means of a droplet ejection method,
    wherein the organic insulating membrane is formed by a droplet ejection method,
    a projecting portion is formed on the active surface of the electronic element, and
    the forming of the organic insulating membrane comprises:
        forming first organic insulting membranes foward and backward of the projecting portion by the droplet ejection method; and
        forming a second organic insulating membrane extended over the first organic insulating membranes forward and backward of the projecting portion by the droplet ejection method.

2. A method for mounting an electronic element according to claim 1, wherein the organic insulating membrane is formed of epoxy resin or urethane resin.

3. A method for forming an electronic element according to cliam 1, further comprising making the active surface of the electronic element liquid affinity prior to forming the organic insulating membrane.

4. A method for forming an electronic element according to claim 1, further comprising making the surface of the organic insulating membrane liquid affinity prior to forming the connection wiring.

5. A method for mounting an electronic element on a wiring board, comprising:
    disposing the electronic element on the wiring board, the electronic element including an active surface with a projecting portion;
    using a droplet ejection method to form an organic insulating membrane on an active surface of the electronic element by:
        forming first organic insulating membranes forward and backward of the projecting portion by the droplet ejection method; and
        forming a second organic insulating membrane extended over the first organic insulating membranes forward and backward of the projecting portion by the droplet ejection method;
    ejecting a material to form an inclined surface connected from a surface of the wiring board to the active surface of the electronic element at peripheries of the electronic element; and
    forming connection wiring for connecting electrode terminals secured on the electronic element to a wiring pattern secured on the wiring board on the inclined surface and the surface of the organic insulating membrane by a droplet ejection method.

6. A method for mounting an electronic element according to claim 5, wherein the organic insulating membrane is formed of epoxy resin or urethane resin.

7. A method for forming an electronic element according to claim 5, further comprising making the active surface of the electronic element liquid affinity prior to forming the organic insulating membrane.

8. A method for forming an electronic element according to claim 5, further comprising making the surface of the organic insulting membrane liquid affinity prior to forming the connection wiring.

* * * * *